United States Patent
Chang et al.

(10) Patent No.: US 8,004,890 B2
(45) Date of Patent: Aug. 23, 2011

(54) OPERATION METHOD OF NON-VOLATILE MEMORY

(75) Inventors: Yao-Wen Chang, Hsinchu (TW); Tao-Cheng Lu, Hsinchu (TW); I-Chen Yang, Hsinchu (TW); Hsing-Wen Chang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 61 days.

(21) Appl. No.: 12/437,826

(22) Filed: May 8, 2009

(65) Prior Publication Data
US 2010/0284220 A1    Nov. 11, 2010

(51) Int. Cl.
*G11C 11/34* (2006.01)
(52) U.S. Cl. .............. 365/185.03; 365/185.24
(58) Field of Classification Search .......... 365/185.03, 365/185.24
See application file for complete search history.

(56) References Cited

U.S. PATENT DOCUMENTS

| | | | |
|---|---|---|---|
| 5,844,841 A * | 12/1998 | Takeuchi et al. | 365/185.03 |
| 7,130,210 B2 * | 10/2006 | Bathul et al. | 365/100 |
| 7,184,304 B2 * | 2/2007 | Nishihara et al. | 365/185.03 |
| 7,206,225 B2 * | 4/2007 | Wu | 365/185.03 |
| 7,242,618 B2 | 7/2007 | Shappir et al. | |
| 7,259,993 B2 | 8/2007 | Redaelli et al. | |
| 2003/0161188 A1 | 8/2003 | Takahashi et al. | |
| 2008/0158954 A1 * | 7/2008 | Hamilton et al. | 365/185.03 |
| 2008/0205135 A1 | 8/2008 | Chu et al. | |
| 2008/0225607 A1 | 9/2008 | Achter | |

FOREIGN PATENT DOCUMENTS

TW       200701237      1/2007

* cited by examiner

*Primary Examiner* — Michael T Tran
(74) *Attorney, Agent, or Firm* — J.C. Patents

(57) ABSTRACT

An operation method of a non-volatile memory for reducing the second-bit effect in the non-volatile memory is suitable for an N-level memory cell having a first storage position and a second storage position (wherein N is a positive integer greater than 2). The method includes following steps: determining sets of operation levels for operating the first storage position according to the level of the second storage position; when the level of the second storage position is a lower level, operating the first storage position according to a first set of operation levels; when the level of the second storage position is a higher level, operating the first storage position according to a second set of operation levels. Each of the levels in the second set of operation levels is greater than the corresponding level in the first set of operation levels.

30 Claims, 19 Drawing Sheets

OPERATION METHOD OF NON-VOLATILE MEMORY

BACKGROUND OF THE INVENTION

1. Field of the Invention

The present invention generally relates to an operation method of a memory, and more particularly, to an operation method of a non-volatile memory for reducing the second-bit effect in the non-volatile memory.

2. Description of Related Art

Due to the advantages of saving, reading and clearing data time after time and still keeping the saved data after cutting power, a non-volatile memory becomes the irreplaceable one in many electric products so as to keep the electric products for normal operations during turning on. Therefore, a non-volatile memory serves as a memory device is broadly used in PCs and electronic equipments.

Among various non-volatile memories, a nitride read only memory (Nbit) is the one based on a charge trapping for storing data. The structure of an Nbit memory cell is just like a metal-oxide-silicon field effect transistor (MOS-FET) except that the gate silicon oxide layer of an MOS-FET is substituted by an ONO layer (oxide-nitride-oxide layer), wherein the silicon nitride material is characteristic of trapping charges (electrons) when the Nbit memory cell is programmed. In order to program (i.e., to inject charges) the charge-trapping layer of an Nbit memory cell, many kinds of processes of hot carrier injection can be used, for example, a process of channel hot electron injection (CHE) or a process of source side injection (SSI). In addition, a process of channel initiated secondary electron (CHISEL) can be used to program the charge-trapping layer of an Nbit memory cell as well. A localized implementation of charge trapping technique allows each Nbit memory cell having two separated charge bits so as to form a so-called 2 bits/cell as a memory.

To judge the physically separated charges at the two sides of an Nbit memory cell, reverse read scheme is adopted. The reverse read scheme means reading operation is done by applying a reading bias to Source terminal to sense the charges above the Drain-side junction, and vice versa. The reading bias is enough high so that it can screen out the influence of the charges above the Source-side junction if there are. However, whenever operating an Nbit memory cell stored by 2-bits, the two bits of the same memory cell might still affect each other to cause troubles. In short, if a bit has stored at one-side of an Nbit memory cell, then, a reading operation for the other portion of the cell with an expected high current would have current-dropping phenomena, called second-bit effect. In other words, when conducting a reading operation on the memory cell, the present bit would affect the memory cell, which raises up the barrier and thereby increases the threshold voltage (Vt) for reading. Consequently, a reading error may occur.

FIG. 1A is a diagram showing a Vt distribution of a conventional 2-bits memory cell. Referring to FIG. 1A, when the level of the second bit is a higher level ("0"), the second-bit effect makes the Vt distribution of the cell drifted so as to narrow the operation window, wherein the first bit of the cell has been at the state "1" already. As a result, when reading the memory cell, the level "1" of the first bit thereof may be misjudged as the level "0".

In addition, the memory size is larger and larger along with increasing sizes of application software of a computer. Therefore, the conventional memory device for storing a bit or two bits can not satisfy the current demands. In this regard, a memory device able to store multi-bits data was provided in recent years, which is termed as a multi-level memory. On the other hand, an Nbit memory cell can serve as a multi-level memory cell (MLC) by setting a plurality of programming verification levels at the two bits thereof. For an MLC however, a more accurate Vt distribution scope is required, which results in a more complicate operation. Besides, the above-mentioned second-bit effect can also occur in an MLC.

FIG. 1B is a diagram showing a Vt distribution of an MLC. Referring to FIG. 1B, when data (with a higher level) is stored at a second storage position of an MLC, the so-called second-bit effect may affect the first storage position; in particular, the higher the level of the second storage position, the more serious the second-bit effect would be. For example, when the second storage position has the highest level ("4"), the second-bit effect may make the Vt distribution of the memory cell drifted so that the drifted Vt distribution is very close to the Vt distribution of the memory cell of being programmed into the state "2", wherein the first storage position thereof has the level state "1". Since the drifted Vt distribution is very close to that of the memory cell of being programmed into the level state "2", the operation window is narrowed. As a result, when reading the memory cell, it is possible to misjudge the level "1" of the first storage position of the memory cell as the level "2".

As described above, the second-bit effect not only results in the operation difficulty on the memory device, but also reduces the reliability thereof. The second-bit effect further reduces the sensing margin and the Vt window for operating the left and right two bits, which makes the operation of a multi-level memory more difficult.

SUMMARY OF THE INVENTION

Accordingly, the present invention is directed to an operation method of a non-volatile memory able to reduce the second-bit effect therein, easily decide the state of the MLC by reading and accordingly avoid a misjudgment caused by the second-bit effect.

The present invention provides an operation method of a non-volatile memory, which is suitable for an N-level memory cell having a first storage position and a second storage position (wherein N is a positive integer greater than 2). The operation method includes following steps: determining a set of operation levels for operating the first storage position according to a level of the second storage position; when the level of the second storage position is a lower level, operating the first storage position according to a first set of operation levels; and when the level of the second storage position is a higher level, operating the first storage position according to a second set of operation levels.

In an embodiment of the present invention, the lower level is a positive integer equal to or smaller than N/2, and the higher level is a positive integer greater than N/2.

In an embodiment of the present invention, the above-mentioned second set of operation levels and the first set of operation levels respectively include a plurality of operation levels from a first operation level to an (N−1)-th operation level respectively having a level sequentially from small one to large one, and the i-th operation level (i=1, ... ,N−1, positive integers) in the second set of operation levels is greater than the i-th operation level in the first set of operation levels. The above-mentioned operation method is a method for programming or a reading method, and the first set of operation levels and the second set of operation levels are sets of programming verification levels or sets of reading levels.

In an embodiment of the present invention, the above-mentioned second set of operation levels and the first set of operation levels respectively include a plurality of operation levels from a first operation level to an (N−1)-th operation level respectively having a level sequentially from small one to large one, and the i-th operation level (i=1, . . . ,N−1, positive integers) in the second set of operation levels is equal to the (i+1)-th operation level in the first set of operation levels.

The present invention provides an operation method of a non-volatile memory, which is suitable for an N-level memory cell having a first storage position and a second storage position (wherein N is a positive integer greater than 2). The method includes following steps: when conducting a programming operation, determining a set of programming verification levels for verifying the state of the first storage position according to the level of the second storage position; when the level of the second storage position is a lower level, verifying the state of the first storage position of being programmed according to a first set of programming verification levels; when the level of the second storage position is a higher level, verifying the state of the first storage position of being programmed according to a second set of operation levels; then, when conducting a reading operation, determining a set of reading levels for reading the first storage position according to the first set of programming verification levels and the second set of programming verification levels, wherein when the programming state of the first storage position is verified based on the first set of programming verification levels, the first storage position is read according to a first set of reading levels corresponding to the first set of programming verification levels; and when the programming state of the first storage position is verified based on the second set of programming verification levels, the first storage position is read according to a second set of reading levels corresponding to the second set of programming verification levels.

In an embodiment of the present invention, the lower level is a positive integer equal to or smaller than N/2, and the higher level is a positive integer greater than N/2.

In an embodiment of the present invention, the above-mentioned second set of programming verification levels and first set of programming verification levels respectively include a plurality of programming verification levels from a first programming verification level to an (N−1)-th programming verification level respectively having a level sequentially from small one to large one, and the i-th programming verification level (i=1, . . . ,N−1, positive integers) in the second set of programming verification levels is greater than the i-th programming verification level in the first set of programming verification levels.

In an embodiment of the present invention, the, above-mentioned the second set of programming verification levels and the first set of programming verification levels respectively comprise a plurality of programming verification levels from a first programming verification level to an (N−1)-th programming verification level respectively having a level sequentially from small one to large one, and the i-th programming verification level (i=1, . . . ,N−1, positive integers) in the second set of programming verification levels is equal to the (i+1)-th programming verification level in the first set of programming verification levels.

In an embodiment of the present invention, the above-mentioned second set of reading levels and first set of reading levels respectively include a plurality of reading levels from a first reading level to an (N−1-th reading level respectively having a level sequentially from small one to large one, and the i-th reading level (i=1, . . . ,N−1, positive integers) in the second set of reading levels is greater than the i-th reading level in the first set of reading levels.

In an embodiment of the present invention, the above-mentioned second set of reading levels and the first set of reading levels respectively include a plurality of reading levels from a first reading level to an (N−1-th reading level respectively having a level sequentially from small one to large one, and the i-th reading level (i=1, . . . ,N−1, positive integers) in the second set of reading levels is equal to the (i+1)-th reading level in the first set of reading levels.

The present invention provides an operation method of a non-volatile memory for reducing the second-bit effect in the non-volatile memory, which is suitable for a memory cell having a first storage position and a second storage position. The method includes following steps: when conducting a programming operation, verifying the state of the memory cell of being programmed according to a first programming verification level; and when both of the first storage position and the second storage position need to be programmed into a higher level, verifying the state of the memory cell of being programmed according to a second programming verification level, wherein the second programming verification level is greater than the first programming verification level.

In an embodiment of the present invention, the above-mentioned operation method of a non-volatile memory for reducing the second-bit effect in the non-volatile memory further includes following steps: conducting a first reverse reading on the first storage position based on a first reading level corresponding to the first programming verification level; conducting a second reverse reading on the first storage position based on a second reading level corresponding to the second programming verification level, wherein the second reading level is greater than the first reading level; conducting a third reverse reading on the second storage position based on one of the first reading level, the second reading level or a third reading level, wherein the third reading level is between the first reading level and the second reading level; and judging the information stored in the memory cell according to the reading results of the first reverse reading, the second reverse reading and the third reverse reading.

In an embodiment of the present invention, the above-mentioned step of judging the information stored in the memory cell according to the reading results of the first reverse reading, the second reverse reading and the third reverse reading includes: when the reading result of the first reverse reading is the same as the reading result of the second reverse reading, taking the reading result as a final result.

In an embodiment of the present invention, the above-mentioned the step of judging the information stored in the memory cell according to the reading results of the first reverse reading, the second reverse reading and the third reverse reading includes: when the reading result of the first reverse reading is different from the reading result of the second reverse reading and the third reverse reading is conducted based on the first reading level, comparing the amount of the reading result of the third reverse reading with the amount of the reading result of the first reverse reading so as to judge the information stored in the memory cell.

In an embodiment of the present invention, the above-mentioned step of judging the information stored in the memory cell according to the reading results of the first reverse reading, the second reverse reading and the third reverse reading includes: when the reading result of the first reverse reading is different from the reading result of the second reverse reading and the third reverse reading is conducted based on the second reading level, comparing the amount of the reading result of the third reverse reading with the amount of the reading result of the second reverse reading so as to judge the information stored in the memory cell.

In an embodiment of the present invention, the above-mentioned step of judging the information stored in the memory cell according to the reading results of the first reverse reading, the second reverse reading and the third reverse reading includes: when the reading result of the first reverse reading is the same as the reading result of the second reverse reading and the third reverse reading is conducted based on the first reading level, judging the information stored in the memory cell according to the reading result of the third reverse reading.

In an embodiment of the present invention, the above-mentioned step of judging the information stored in the memory cell according to the reading results of the first reverse reading, the second reverse reading and the third reverse reading includes: when the reading result of the first reverse reading is the same as the reading result of the second reverse reading and the third reverse reading is conducted based on the second reading level, judging the information stored in the memory cell according to the reading result of the third reverse reading.

In an embodiment of the present invention, the above-mentioned step of judging the information stored in the memory cell according to the reading results of the first reverse reading, the second reverse reading and the third reverse reading on the second storage position includes: when the reading result of the first reverse reading is different from the reading result of the second reverse reading and the third reverse reading is conducted based on the first reading level, comparing the amount of the reading result of the third reverse reading with the amount of the reading result of the first reverse reading so as to judge the information stored in the memory cell.

In an embodiment of the present invention, the above-mentioned step of judging the information stored in the memory cell according to the reading results of the first reverse reading, the second reverse reading and the third reverse reading includes: when the reading result of the first reverse reading is different from the reading result of the second reverse reading and the third reverse reading is conducted based on the second reading level, comparing the amount of the reading result of the third reverse reading with the amount of the reading result of the second reverse reading so as to judge the information stored in the memory cell.

In an embodiment of the present invention, the above-mentioned step of judging the information stored in the memory cell according to the reading results of the first reverse reading, the second reverse reading and the third reverse reading includes: when the reading result of the first reverse reading is different from the reading result of the second reverse reading and the third reverse reading is conducted based on the third reading level, judging the information stored in the memory cell according to the reading result of the third reverse reading.

In an embodiment of the present invention, the above-mentioned operation method of a non-volatile memory for reducing the second-bit effect in the non-volatile memory further includes: when conducting a reading operation, conducting a first reverse reading on the second storage position based on a first reading level corresponding to the first programming verification level; conducting a second reverse reading on the first storage position based on the first reading level or a second reading level corresponding to the second programming verification level according to the reading result of the first reverse reading on the second storage position, wherein the second reading level is greater than the first reading level; and judging the information stored in the memory cell according to the reading result of the reverse reading.

The present invention provides a non-volatile memory. The non-volatile memory includes a source region and a drain region disposed in a substrate, a charge storage structure disposed between the source region and the drain region on the substrate, wherein the charge storage structure has a first storage position and a second storage position, a gate disposed on the charge storage structure, and a logic determining a set of operation levels for operating the first storage position according to a level of the second storage position, when the level of the second storage position is a lower level, operating the first storage position according to a first set of operation levels, and when the level of the second storage position is a higher level, operating the first storage position according to a second set of operation levels.

In an embodiment of the present invention, the above-mentioned non-volatile memory is an N-level non-volatile memory (wherein N is a positive integer greater than 2), the second set of operation levels and the first set of operation levels respectively include a plurality of operation levels from a first operation level to an (N−1)-th operation level respectively having a level sequentially from small one to large one, and the i-th operation level (i=1, . . . ,N−1, positive integers) in the second set of operation levels is greater than the i-th operation level in the first set of operation levels.

In an embodiment of the present invention, the above-mentioned non-volatile memory is an N-level non-volatile memory (wherein N is a positive integer greater than 2), the second set of operation levels and the first set of operation levels respectively include a plurality of operation levels from a first operation level to an (N−1-th operation level respectively having a level sequentially from small one to large one, and the i-th operation level (i=1, . . . ,N−1, positive integers) in the second set of operation levels is equal to the (i+1)-th operation level in the first set of operation levels.

In an embodiment of the present invention, the above-mentioned first set of operation levels and the second set of operation levels are sets of programming verification levels or sets of reading levels.

The present invention provides a non-volatile memory. The non-volatile memory includes a source region and a drain region disposed in a substrate, a charge storage structure disposed between the source region and the drain region on the substrate, wherein the charge storage structure has a first storage position and a second storage position, a gate disposed on the charge storage structure, and a logic conducting a programming operation to verify the state of the memory of being programmed according to a first programming verification level, when both of the first storage position and the second storage position need to be programmed into a higher level, verifying the state of the memory of being programmed according to a second programming verification level, wherein the second programming verification level is greater than the first programming verification level.

In an embodiment of the present invention, the above-mentioned logic further performs steps of conducting a first reverse reading on the first storage position based on a first reading level corresponding to the first programming verification level, conducting a second reverse reading on the first storage position based on a second reading level corresponding to the second programming verification level, wherein the second reading level is greater than the first reading level, and conducting a third reverse reading on the second storage position based on one of the first reading level, the second reading level or a third reading level, wherein the third reading level is between the first reading level and the second reading level, and judging the information stored in the memory cell according to reading results of the first reverse reading, the second reverse reading and the third reverse reading.

According to the described above, the operation method for reducing the second-bit effect in the non-volatile memory provided by the present invention adopts two sets of programming verification levels and two sets of reading levels on MLC applications. When the method is used in a memory cell, if the second storage position has a higher level, the second set of programming verification levels which is greater than the first set of programming verification levels is used to program the memory cell into the one with a level greater than that of the second set of programming verification levels. Then, when conducting a reading on the memory cell, the state of the memory cell can be easily judged by reading according to the two sets of reading levels corresponding to the two sets of programming verification levels. In this way, the invented method can increase the operation window of an MLC and avoid a misjudgement caused by the second-bit effect.

Since the operation method of a non-volatile memory for reducing the second-bit effect in the non-volatile memory provided by the present invention adopts two sets of programming verification levels and two (or three) sets of reading levels, when the method is used in a 2-bits memory cell and if both the first storage position and the second storage position need to be programmed into ones with a higher level, the second programming verification levels which are greater than the first programming verification levels are used to program the memory cell into the one with a level greater than the second programming verification levels. Then, when conducting a reading on the memory cell, the state of the memory cell can be easily judged by reading according to the two reading levels corresponding to the two programming verification levels in association with a forward reading and two reverse readings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
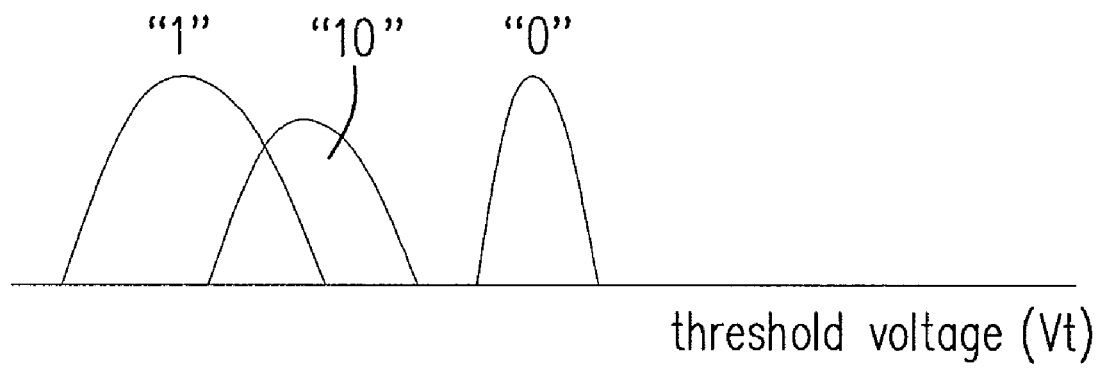
FIG. 1A is a diagram showing a Vt distribution of a conventional 2-bits memory cell.
Figure 1B:
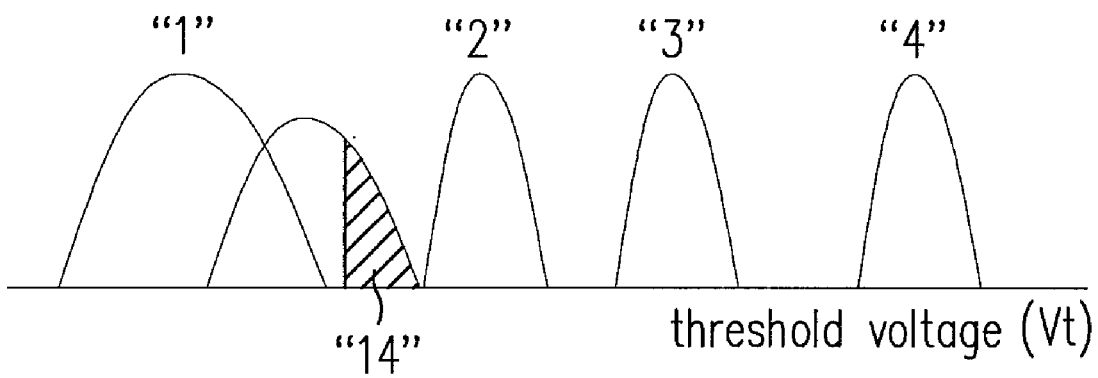
FIG. 1B is a diagram showing a Vt distribution of a conventional multi-level memory cell (MLC).

Reference will now be made in detail to the present preferred embodiments of the invention, examples of which are illustrated in the accompanying drawings. Wherever possible, the same reference numbers are used in the drawings and the description to refer to the same or like parts.

The present invention provides an operation method of a non-volatile memory, which is able to reduce the second-bit effect in the non-volatile memory. The invented operation method is suitable for an MLC with two storage positions or a single-level memory cell. The MLC can provide n bits stored in each of the storage positions, wherein each MLC includes $2^n$ states with different Vt values.

In order to reduce the second-bit effect, the invented operation method determines two sets of operation levels for operating the first storage position according to the level of the second storage position. When the level of the second storage position is a lower level, the first storage position is operated according to the first set of operation levels; when the level of the second storage position is a higher level, the first storage position is operated according to the second set of operation levels.

In an embodiment, if the MLC has N levels (N is a positive integer greater than 2), the lower level is a positive integer equal to or smaller than N/2, and the higher level is a positive integer greater than N/2. For example, if the MLC has four levels, numbers 1, 2, 3 and 4 respectively represent a level sequentially from small one to large one. The levels "1" and "2" are lower levels, and the levels "3" and "4" are higher levels.

In an embodiment, if the MLC has N levels, the second set of operation levels and the first set of operation levels respectively include a plurality of operation levels from a first operation level to an (N−1-th operation level respectively having a level sequentially from small one to large one, and the i-th operation level (i=1, ... ,N−1, positive integers) in the second set of operation levels is greater than the i-th operation level in the first set of operation levels. For example, the first operation level in the second set of operation levels is greater than the first operation level in the first set of operation levels; the second operation level in the second set of operation levels is greater than the second operation level in the first set of operation levels.

In another embodiment, the second set of operation levels and the first set of operation levels respectively comprise a plurality of operation levels from a first operation level to an (N−1-th operation level respectively having a level sequentially from small one to large one, and the i-th operation level (i=1, ... ,N−1, positive integers) in the second set of operation levels is equal to the (i+1)-th operation level in the first set of operation levels. For example, the first operation level in the second set of operation levels is equal to the second operation level in the first set of operation levels; the second operation level in the second set of operation levels is equal to the third operation level in the first set of operation levels. However, the (N−1-th operation level in the second set of operation levels is greater than the (N−1-th operation level in the first set of operation levels.

The operation method of the present invention can be a method for programming or a reading method. When the operation method serves as a method for programming, the first set of operation levels and the second set of operation levels are sets of programming verification levels; when the operation method serves as a reading method, the first set of operation levels and the second set of operation levels are sets of reading levels.

The operation method of a non-volatile memory for reducing the second-bit effect in the non-volatile memory is depicted in more details in the following embodiments.

Figure 2A:
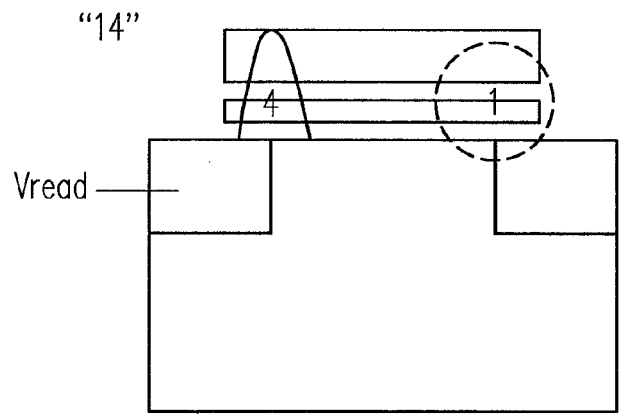
FIGS. 2A-2C are diagrams of representations of an MLC according to the present invention.
Figure 2B:
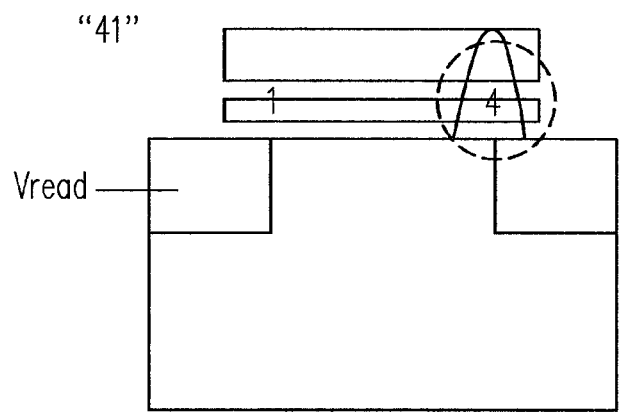
Figure 2C:
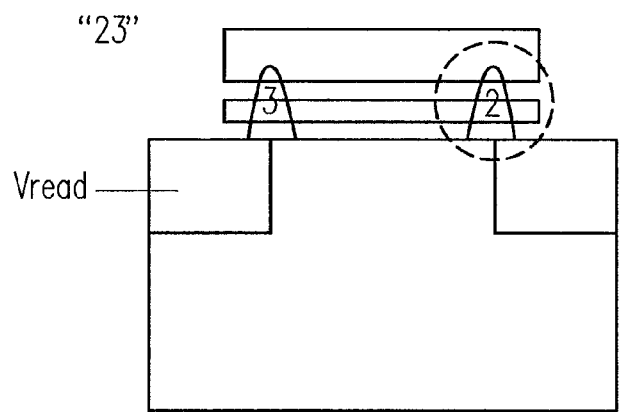

FIGS. 2A-2C are diagrams of representations of an MLC according to the present invention. The memory cell includes a source region and a drain region disposed in a substrate, a charge storage structure disposed between the source region and the drain region on the substrate, wherein the charge storage structure has a first storage position and a second storage position, and a gate disposed on the charge storage structure. In the following embodiments, each storage position can be programmed into, for example, four levels; but the invented operation method certainly suits various MLCs. In the present invention, "xy" represents the programming levels of the first storage position and the second storage position, wherein x represents the level of the storage position to be read, y represents the level of the adjacent storage position and numbers 1, 2, 3 and 4 respectively represent a level sequentially from small one to large one.

For example, as shown by FIG. 2A, in "14", 1 represents the level of the storage position to be read and 4 represents the level of the adjacent storage position. Referring to FIG. 2B, in "41", 4 represents the level of the storage position to be read and 1 represents the level of the adjacent storage position. Referring to FIG. 2C, in "23", 2 represents the level of the storage position to be read and 3 represents the level of the adjacent storage position.

Figure 3A:
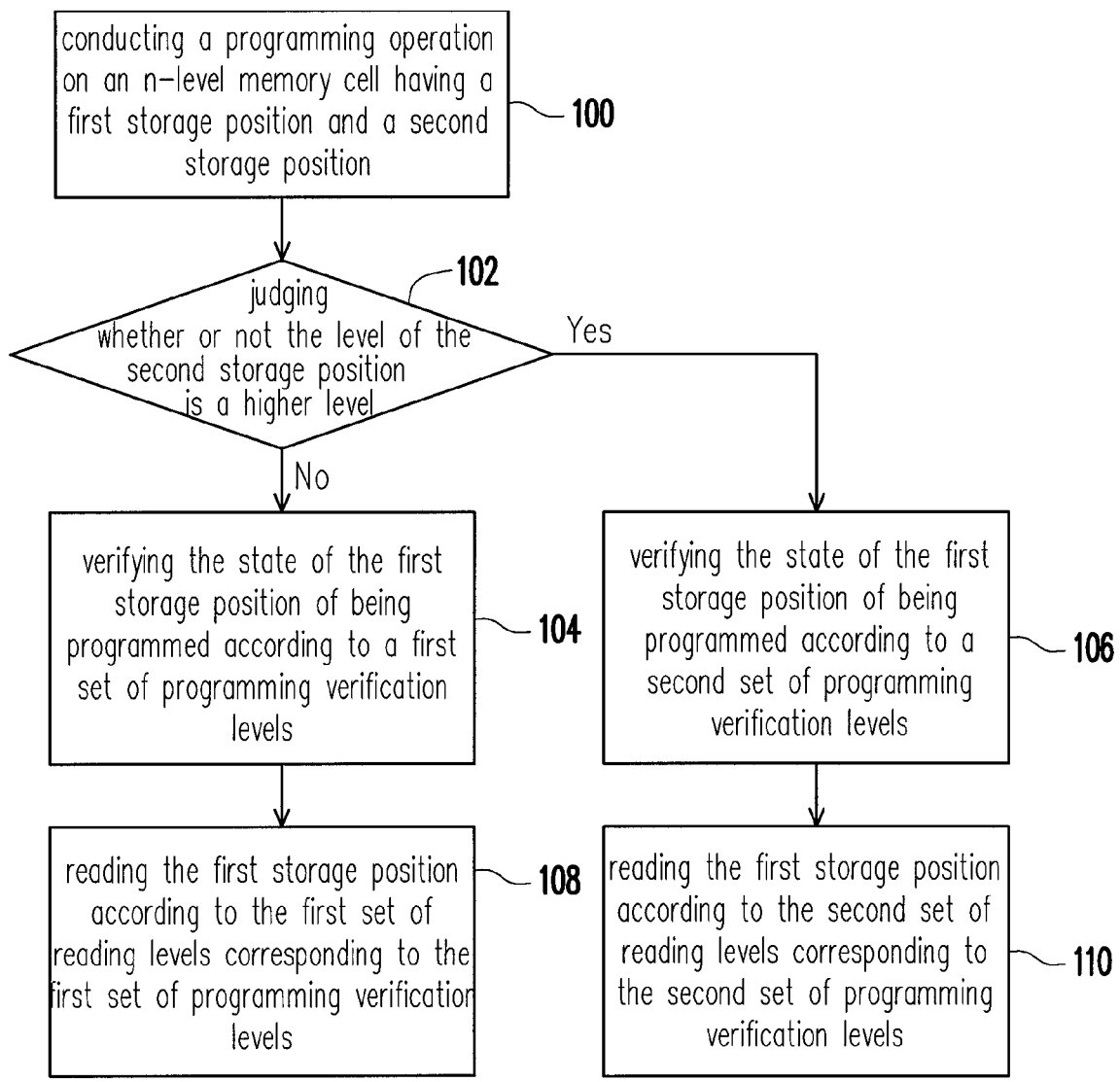
FIG. 3A is a schematic flow chart of an operation method of a non-volatile memory for reducing the second-bit effect thereof according to the present invention.
Figure 3B:
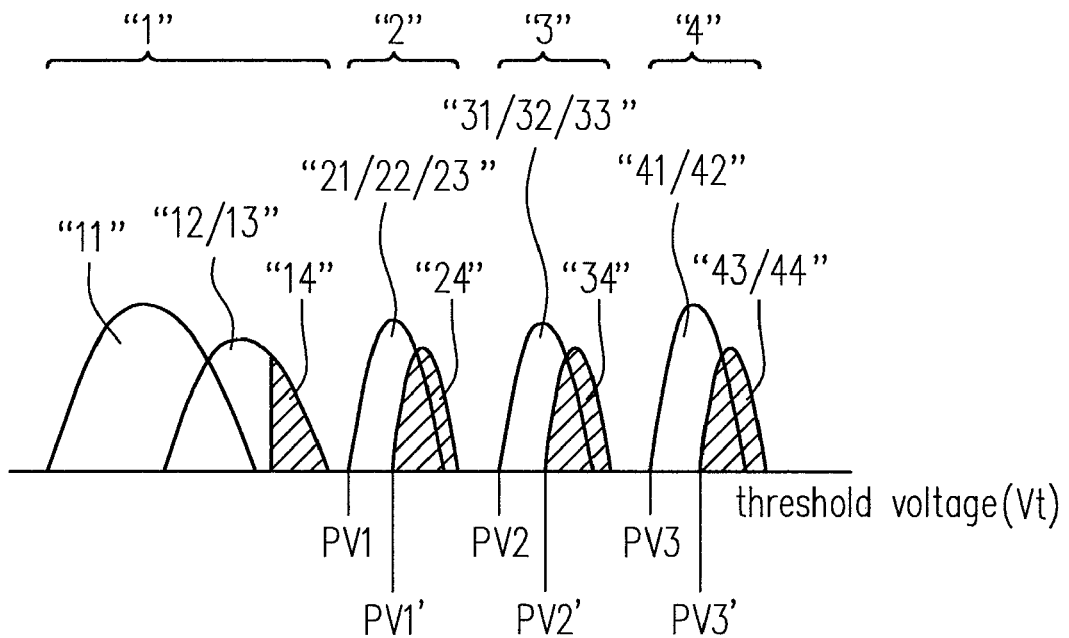
FIG. 3B is a diagram showing different programming verification levels of an MLC according to the present invention.
Figure 3C:
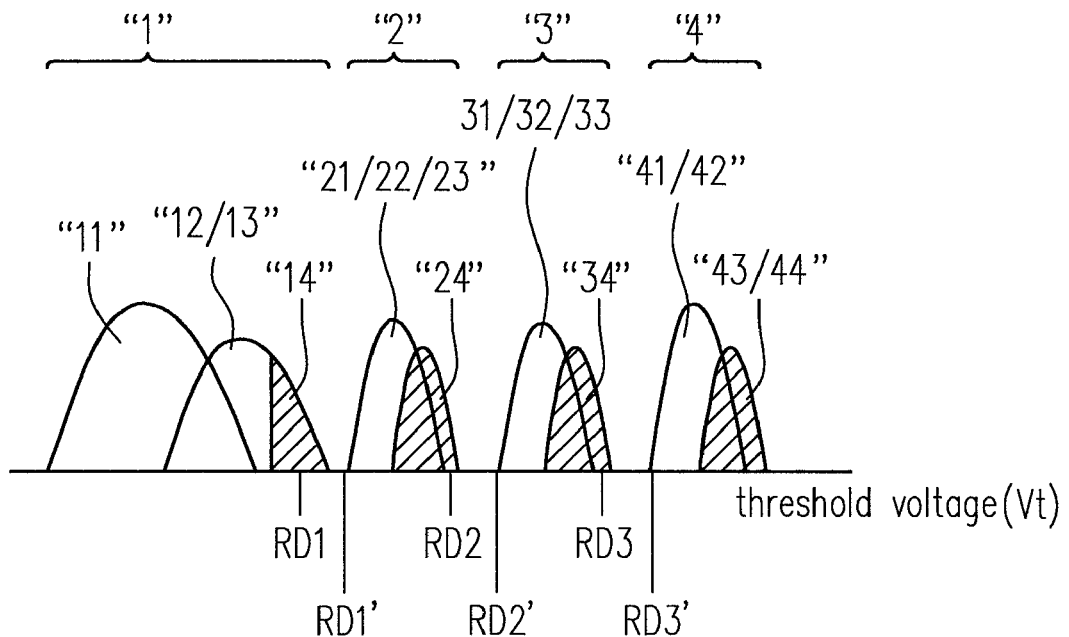
FIG. 3C is a diagram showing different reading levels of an MLC according to the present invention.
Figure 4A:
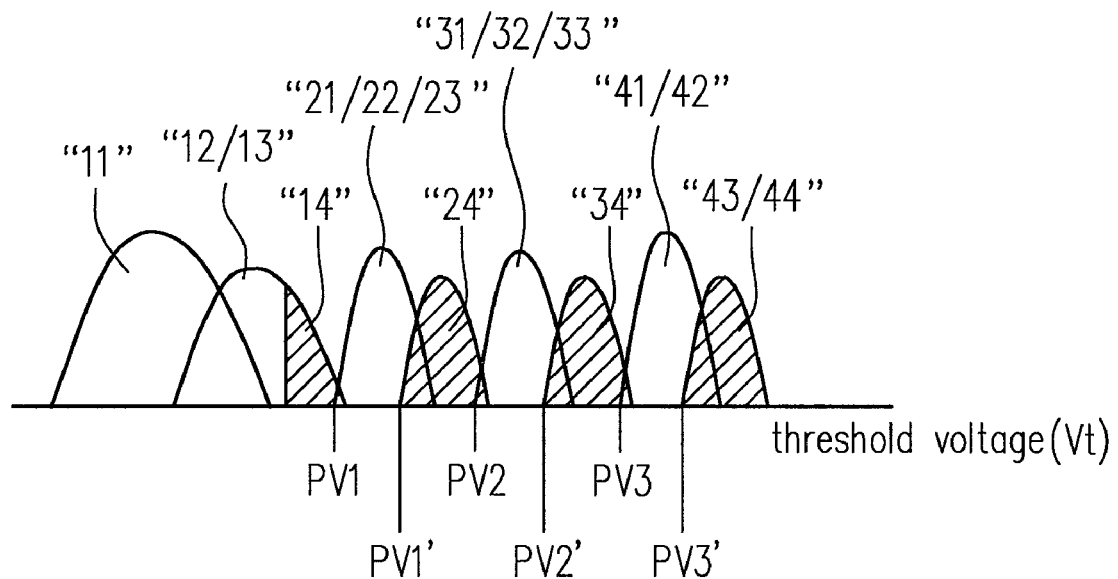
FIG. 4A is a diagram showing different programming verification levels of an MLC according to the present invention.
Figure 4B:
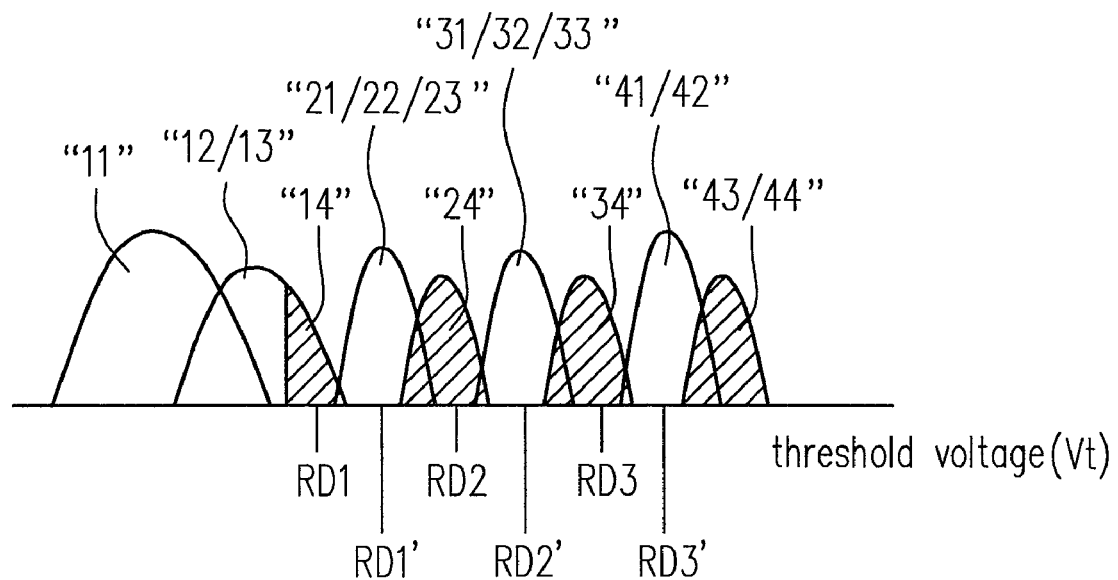
FIG. 4B is a diagram showing different reading levels of an MLC according to the present invention.
Figure 5A:
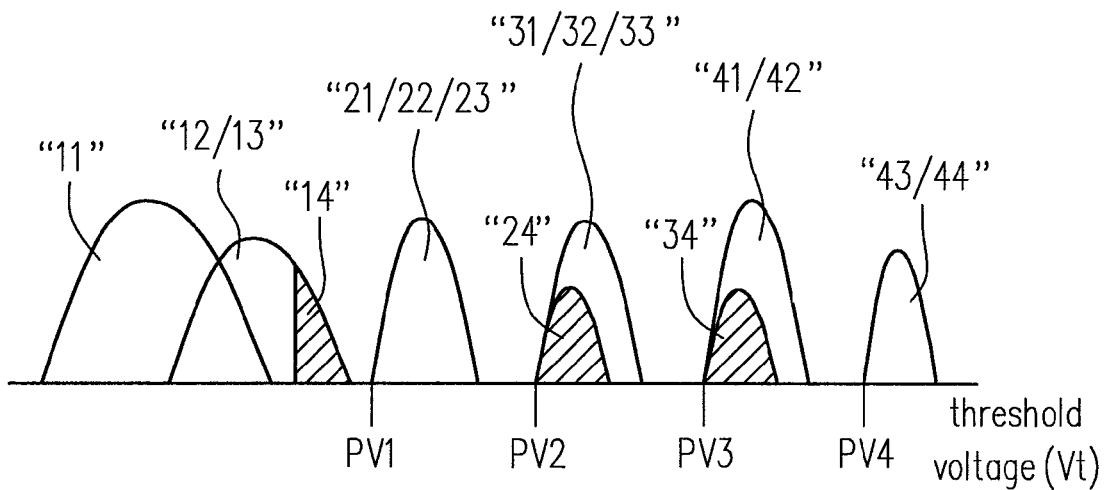
FIG. 5A is a diagram showing different programming verification levels of an MLC according to the present invention.
Figure 5B:
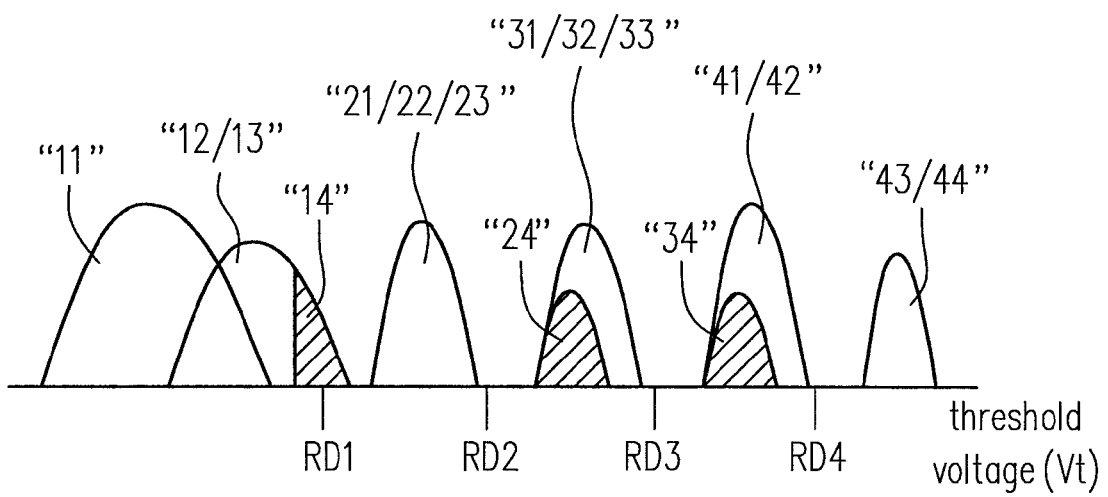
FIG. 5B is a diagram showing different reading levels of an MLC according to the present invention.

FIG. 3A is a schematic flow chart of an operation method of a non-volatile memory for reducing the second-bit effect thereof according to the present invention. FIGS. 3B, 4A and 5A are diagrams respectively showing different programming verification levels of an MLC according to the present invention. FIGS. 3C, 4B and 5B are diagrams respectively showing different reading levels of an MLC according to the present invention. In FIGS. 3B and 3C, the Vt distribution of the level "1" includes "11", "12"", "13" and "14"; the Vt distribution of the level "2" includes "21", "22"", "23" and "24"; the Vt distribution of the level "3" includes "31", "32"", "33" and "34"; the Vt distribution of the level "4" includes "41", "42"", "43" and "44".

Referring to FIGS. 3A, 3B and 3C, when conducting a programming operation on an N-level memory cell (wherein N is a positive integer greater than 2) having a first storage position and a second storage position (step 100), it is judged whether or not the level of the second storage position is a higher level (step 102) so as to determine the set of programming verification levels for verifying the state of the first storage position. For example, if the level of the second storage position is levels "3" or "4", it is indicated that the level of the second storage position is at the higher levels; if the level of the second storage position is levels "1" or "2", it is indicated that the level of the second storage position is at the lower levels.

When the level of the second storage position is the lower levels ("1" or "2"), the state of the first storage position of being programmed is verified according to a first set of programming verification levels (PV1, PV2, PV3) (step 104). When the level of the second storage position is the higher levels ("3" or "4"), the state of the first storage position of being programmed is verified according to a second set of programming verification levels (PV1', PV2', PV3') (step 106).

In the embodiment, the first set of programming verification levels includes a plurality of programming verification levels (PV1, PV2, PV3) respectively having a level sequentially from small one to large one; the second set of programming verification levels includes a plurality of programming verification levels (PV1', PV2', PV3') respectively having a level sequentially from small one to large one. The programming verification level PV1' herein is greater than the programming verification level PV1; the programming verification level PV2' herein is greater than the programming verification level PV2; the programming verification level PV3' herein is greater than the programming verification level PV3.

To conduct a reading operation, the set of reading levels for reading the first storage position is determined according to the first set of programming verification levels (PV1, PV2, PV3) and the second set of programming verification levels (PV1', PV2', PV3'). When the programming state of the first storage position is verified according to the first set of programming verification levels (PV1, PV2, PV3), the first storage position is read according to the first set of reading levels (RD1, RD2, RD3) corresponding to the first set of programming verification levels (PV1, PV2, PV3) (step 108). When the programming state of the first storage position is verified according to the second set of programming verification levels (PV1', PV2', PV3'), the first storage position is read according to the second set of reading levels (RD1', RD2', RD3') corresponding to the second set of programming verification levels (PV1', PV2', PV3') (step 110).

In the embodiment, the first set of reading levels and the second set of reading levels are set respectively according to the first set of programming verification levels and the second set of programming verification levels. The first set of reading levels includes a plurality of reading levels respectively having a level sequentially from small one to large one (RD1, RD2, RD3); the second set of reading levels includes a plurality of reading levels respectively having a level sequentially from small one to large one (RD1', RD2', RD3'). Herein, the reading level RD1' is greater than the reading level RD1; the reading level RD2' is greater than the reading level RD2; the reading level RD3' is greater than the reading level RD3.

In the prior art, when the level of the second storage position is the highest level ("4"), the second-bit effect makes the Vt distribution of the memory cell of being programmed into the state "14" drifted and very close to the Vt distribution of the memory cell of being programmed into the state "2y". Although when reading the memory cell based on the first set of reading levels (RD1, RD2, RD3) corresponding to the first set of programming verification levels (PV1, PV2, PV3), it can be judged whether or not the second storage position is "4" so as to distinguish the state "14" from the states "21", "22" and "23", however, it is still unable to distinguish the state "14" from the state "24", which easily causes misjudgement.

In order to solve the above-mentioned problem, the present invention adopts the following scheme that when the level of the second storage position is the highest level ("4"), the second set of programming verification levels (PV1', PV2', PV3') is used, as shown by FIG. 3B, to program the memory cell of the state "24" into the one with a level greater than the programming verification level PV1', the memory cell of the state "34" into the one with a level greater than the programming verification level PV2' and the memory cell of the state "44" into the one with a level greater than the programming verification level PV3'.

After that, when reading the memory cell and finding out the second storage position is the highest level ("4"), the second set of reading levels (RD1', RD2', RD3') corresponding to the second set of programming verification levels (PV1', PV2', PV3') is used to easily distinguish the states "14", "24", "34" and "44" from each other. On the other hand, when reading the memory cell and finding out the second storage position is a lower level ("1", "2" or "3"), the first set of reading levels (RD1, RD2, RD3) corresponding to the first set of programming verification levels (PV1, PV2, PV3) is used.

In addition, the first storage position corresponding to the memory cell of the state "43" always takes the highest level ("4"), therefore, the level of the second storage position corresponding to the memory cell of the state "43" would be affected by the second-bit effect. Consequently, when detecting the level of the second storage position corresponding to the memory cell of the state "43", "3" may be misjudged as "4", which results in taking the second reading level RD3' for reading the memory cell; and thereby, it is unable to correctly judge the level of the first storage position corresponding to the memory cell of the state "43", i.e. the level "3" or the level "4" is unable to distinguished from each other. To solve the problem, the above-mentioned scheme is used, as shown by FIGS. 3B and 3C, the memory cell of the state "43" is programmed into the one with a level greater than the programming verification level PV3'. In this way, when detecting the level of the second storage position corresponding to the memory cell of the state "43", even a misjudgement occurs so as to use the second reading level RD3' to read the memory cell, it still can be correctly judged that the level of the first storage position corresponding to the memory cell of the state "43" is "4".

In the embodiment, as shown by FIGS. 3B and 3C, the Vt distribution of the level "1", the Vt distribution of the level "2", the Vt distribution of the level "3" and the Vt distribution of the level "4" are spaced from each other. The present invention certainly can make the Vt distribution of the level "1", the Vt distribution of the level "2", the Vt distribution of the level "3" and the Vt distribution of the level "4" partially overlapped each other, as shown by FIGS. 4A and 4B, by appropriately setting the first set of programming verification levels, the second set of programming verification levels, the first set of reading levels and the second set of reading levels.

In another embodiment of the present invention, as shown by FIGS. 5A and 5B, first, the first programming verification level PV2 serves as the second programming verification level PV1' and the first programming verification level PV3 serves as the second programming verification level PV2'. Then, a new programming verification level PV4 is created and serves as the second programming verification level PV3'. Accordingly, the first set of programming verification levels includes a plurality of programming verification levels (PV1, PV2, PV3) respectively having a level sequentially from small one to large one, and the second set of programming verification levels includes a plurality of programming verification levels (PV2, PV3, PV4) respectively having a level sequentially from small one to large one. Further, the first set of reading levels and the second set of reading levels are set respectively according to the first set of programming verification levels and the second set of programming verification levels, wherein the first set of reading levels includes a plurality of operation levels (RD1, RD2, RD3) respectively having a level sequentially from small one to large one, and the second set of reading levels includes a plurality of operation levels (RD2, RD3, RD4) respectively having a level sequentially from small one to large one.

When the level of the second storage position is the highest level ("4"), the second set of programming verification levels (PV2, PV3, PV4) is used, as shown by FIGS. 5A and 5B, to program the memory cell of the state "24" into the one with a level greater than the programming verification level PV2, the memory cell of the state "34" into the one with a level greater than the programming verification level PV3 and the memory cell of the state "44" into the one with a level greater than the programming verification level PV4. After that, when reading the memory cell and finding out the second storage position is the highest level ("4"), the second set of reading levels (RD2, RD3, RD4) corresponding to the second set of programming verification levels (PV2, PV3, PV4) is used for reading the memory cell so as to easily distinguish the states "14", "24", "34" and "44" from each other.

In addition, as shown by FIGS. 5A and 5B, the memory cell of the state "43" is also programmed into the one with a level greater than the programming verification level PV4. In this way, when detecting the level of the second storage position corresponding to the memory cell of the state "43", even a misjudgement occurs so as to use the second reading level RD4 to read the memory cell, it still can be correctly judged that the level of the first storage position corresponding to the memory cell of the state "43" is "4".

Since the operation method of a non-volatile memory for reducing the second-bit effect in the non-volatile memory provided by the present invention adopts two sets of programming verification levels and two sets of reading levels, the invented scheme is advantageous in increasing the operation window on an MLC and avoiding a misjudgement caused by the second-bit effect.

The operation method of a non-volatile memory for reducing the second-bit effect in the non-volatile memory provided by the present invention can be used in a 2-bits memory cell.

FIGS. 6A-6D are diagrams of representations of a 2-bits memory cell according to the present invention. In the present invention, "xy" represents the programming levels of the first storage position and the second storage position, wherein x represents the level of the storage position to be read, y represents the level of the adjacent storage position and number 0 represents a higher level.

Figure 6A:
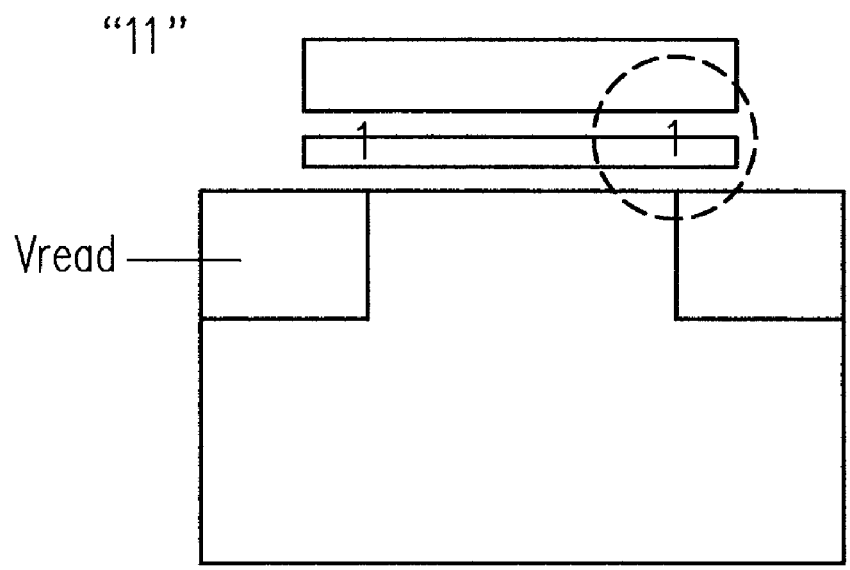
FIGS. 6A-6D are diagrams of representations of a 2-bits memory cell according to the present invention.
Figure 6B:
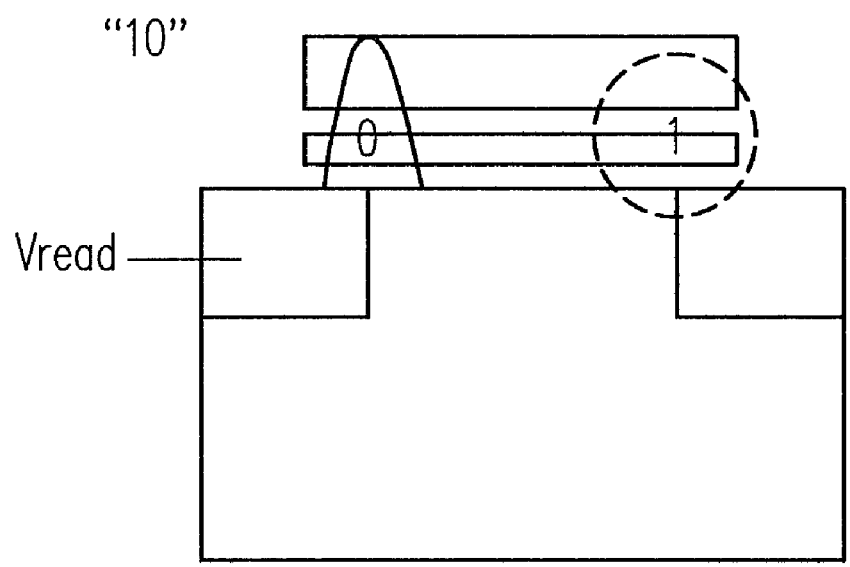
Figure 6C:
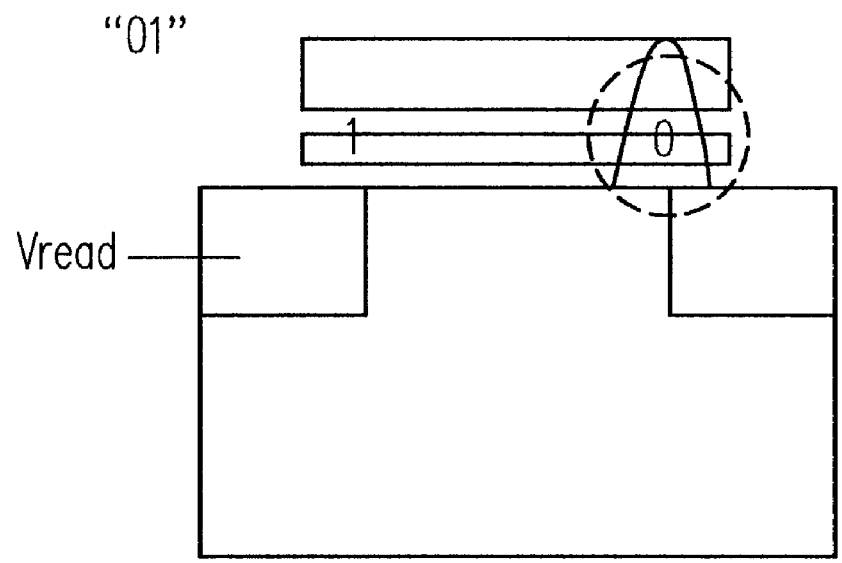
Figure 6D:
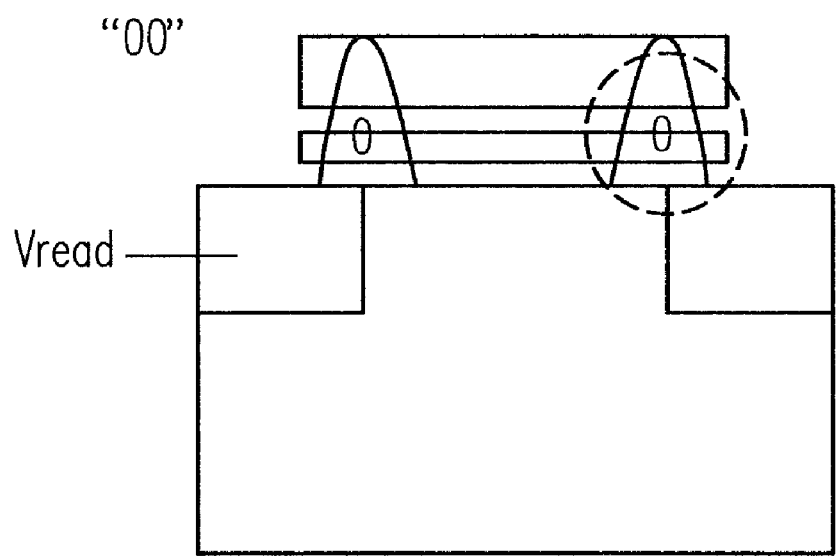

For example, as shown by FIG. 6A, in "11", the first 1 of "11" represents the level of the storage position to be read and the second 1 of "11" represents the level of the adjacent storage position. Referring to FIG. 6B, in "10", 1 represents the level of the storage position to be read and 0 represents the level of the adjacent storage position; referring to FIG. 6C, in "01", 0 represents the level of the storage position to be read and 1 represents the level of the adjacent storage position; referring to FIG. 6D, in "00", the first 0 of "00" represents the level of the storage position to be read and the second 0 of "00" represents the level of the adjacent storage position.

Figure 7A:
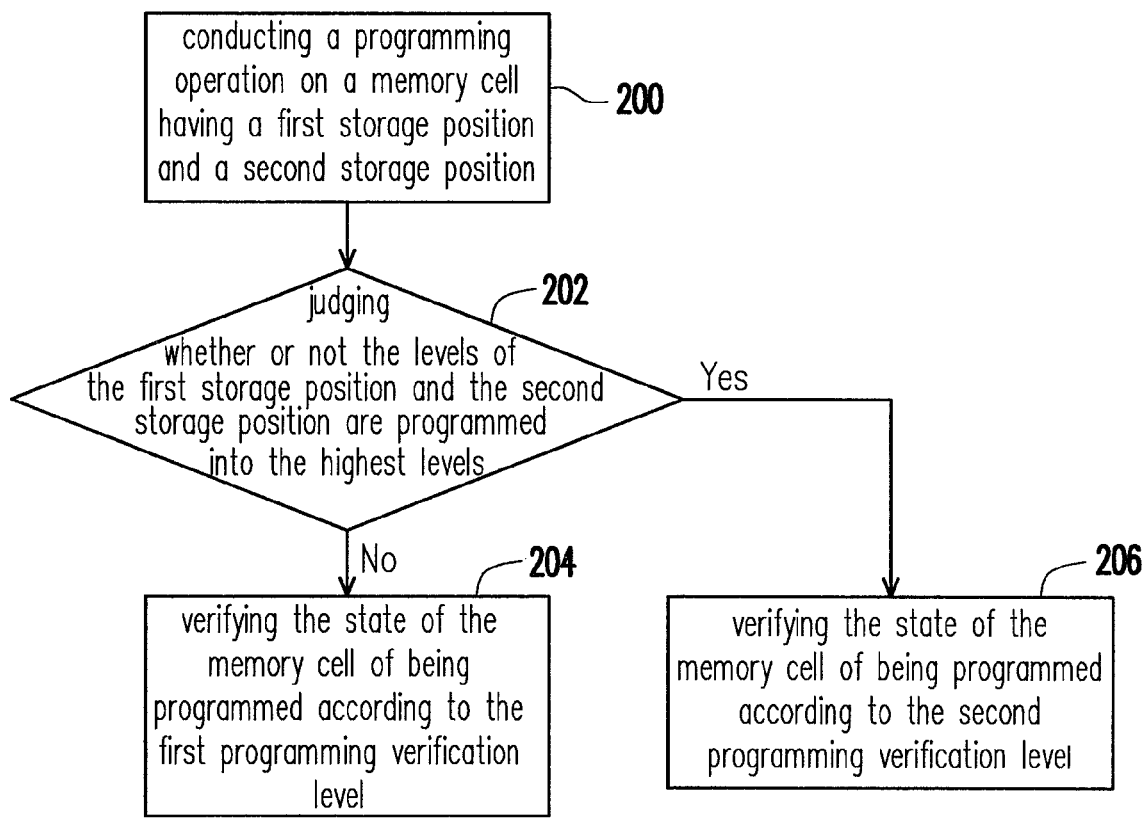
FIG. 7A is a schematic flow chart of a programming method of a non-volatile memory for reducing the second-bit effect thereof according to the present invention.
Figure 7B:
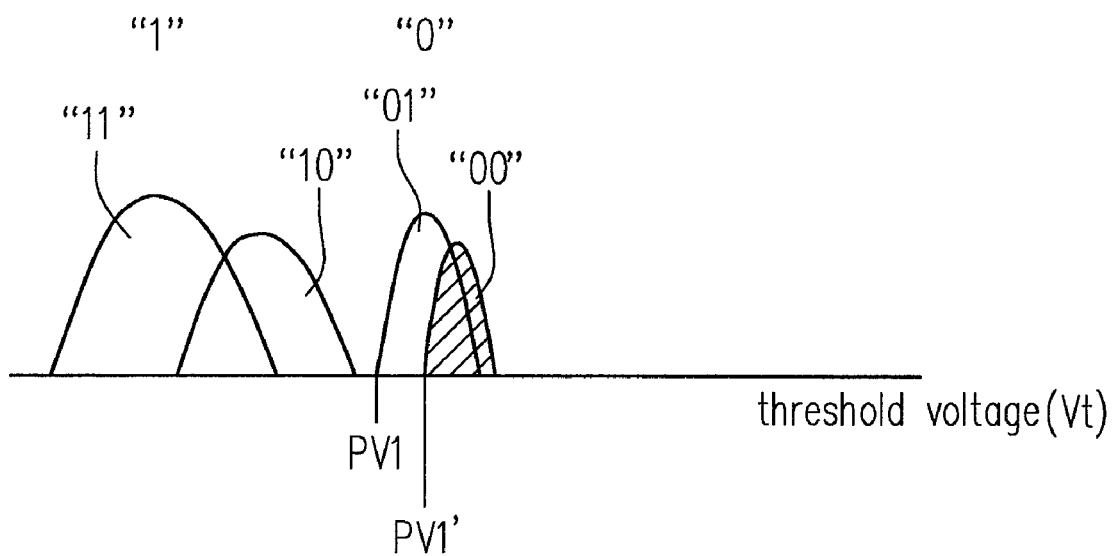
FIG. 7B is a diagram showing different programming verification levels of an MLC according to the present invention.
Figure 7C:
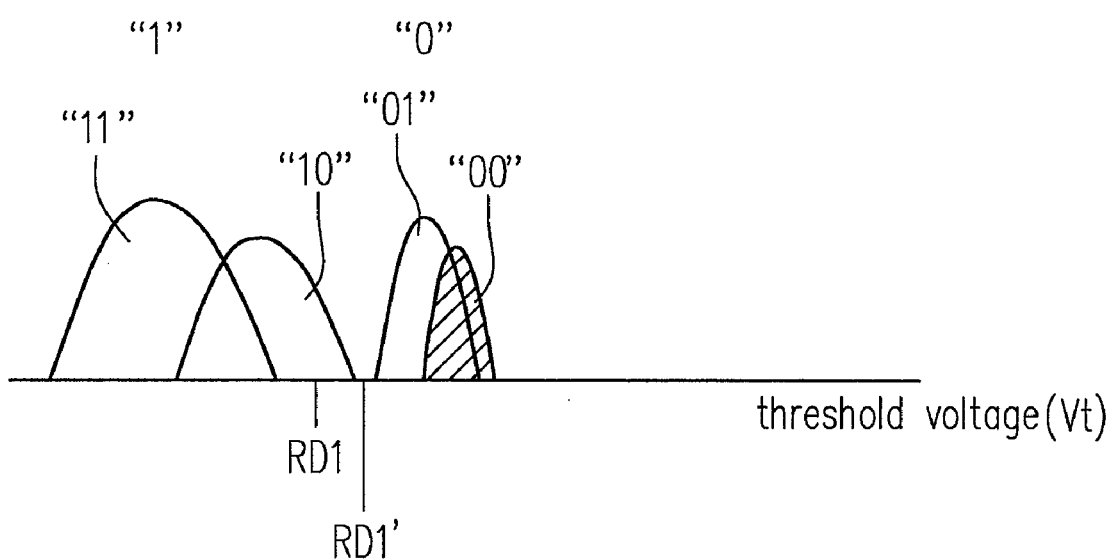
FIG. 7C is a diagram showing different reading levels of an MLC according to the present invention.

FIG. 7A is a schematic flow chart of an operation method of a non-volatile memory for reducing the second-bit effect thereof according to the present invention, FIG. 7B is a diagram showing different programming verification levels of a two-bit SLC according to the present invention and FIG. 7C is a diagram showing different reading levels of a two-bit SLC according to the present invention In FIGS. 7B and 7C, the Vt distribution of the level "1" includes "11" and "10"; the Vt distribution of the level "0" includes "01" and "00".

Referring to FIGS. 7A, 7B and 7C, when conducting a programming operation on a memory cell having a first storage position and a second storage position (step 200), it is judged whether or not the levels of the first storage position and the second storage position are both programmed into higher levels (i.e. the state "00") (step 202). When one of the level of the first storage position and the level of the second storage position is not the higher level (i.e., they presently are the state "11", the state "10" or the state "01"), the state of the memory cell of being programmed is verified according to the first programming verification level PV1 (step 204). When both of the first storage position and the second storage position need to be programmed into the ones with the higher level (i.e., the state "00"), the state of the memory cell of being programmed is verified according to the second programming verification level PV2 (step 206). The second programming verification level PV2 herein is greater than the first programming verification level PV1. The reading levels RD1 and RD2 for reading the first storage position are set according to the first programming verification level PV1 and the second programming verification level PV2.

In the prior art, when the level of the second storage position is a higher level ("0"), the second-bit effect makes the Vt distribution of the memory cell of being programmed into the state "10" drifted and very close to the Vt distribution of the memory cell of being programmed into the state "0y". Therefore, when reading the memory cell of the state "10" by using the first reading level RD1 corresponding to the first programming verification level PV1, it is unable to judge whether the level of the first storage position corresponding to the memory cell of the state "10" is "1" or "0".

In order to solve the above-mentioned problem, the present invention adopts the following scheme that when both the first storage position and the second storage position need to be programmed into the higher level (i.e., the state "00"), the second programming verification level (PV2) is used, as shown by FIG. 7B, to program the memory cell of the state "00" into the one with a level greater than the programming verification level PV2. After that, as shown by FIG. 7C, when reading the memory cell, the reading levels RD1 and RD2 are used to reading the memory cell in association with the reverse readings of the first storage position and the second storage position, so as to easily judge the state of the memory cell by reading. However, it can also easily judge the state of the memory cell by reading according to the reading levels RD1 and RD2 and the RD3 (between RD1 and RD2) in association with the reverse readings of the first storage position and the second storage position.

In the following, the operation method of a non-volatile memory for reducing the second-bit effect in the non-volatile memory provided by the present invention is depicted in more details. In the following referred diagrams, when conducting a reverse reading on the first storage position of a memory cell, the reading levels RD1, RD2 and RD3 respectively serve as the reading levels RR1, RR2 and RR3; when conducting a reverse reading on the second storage position of a memory cell, the reading levels RD1, RD2 and RD3 respectively serve as the reading levels FR1, FR2 and FR3.

Figure 8A:
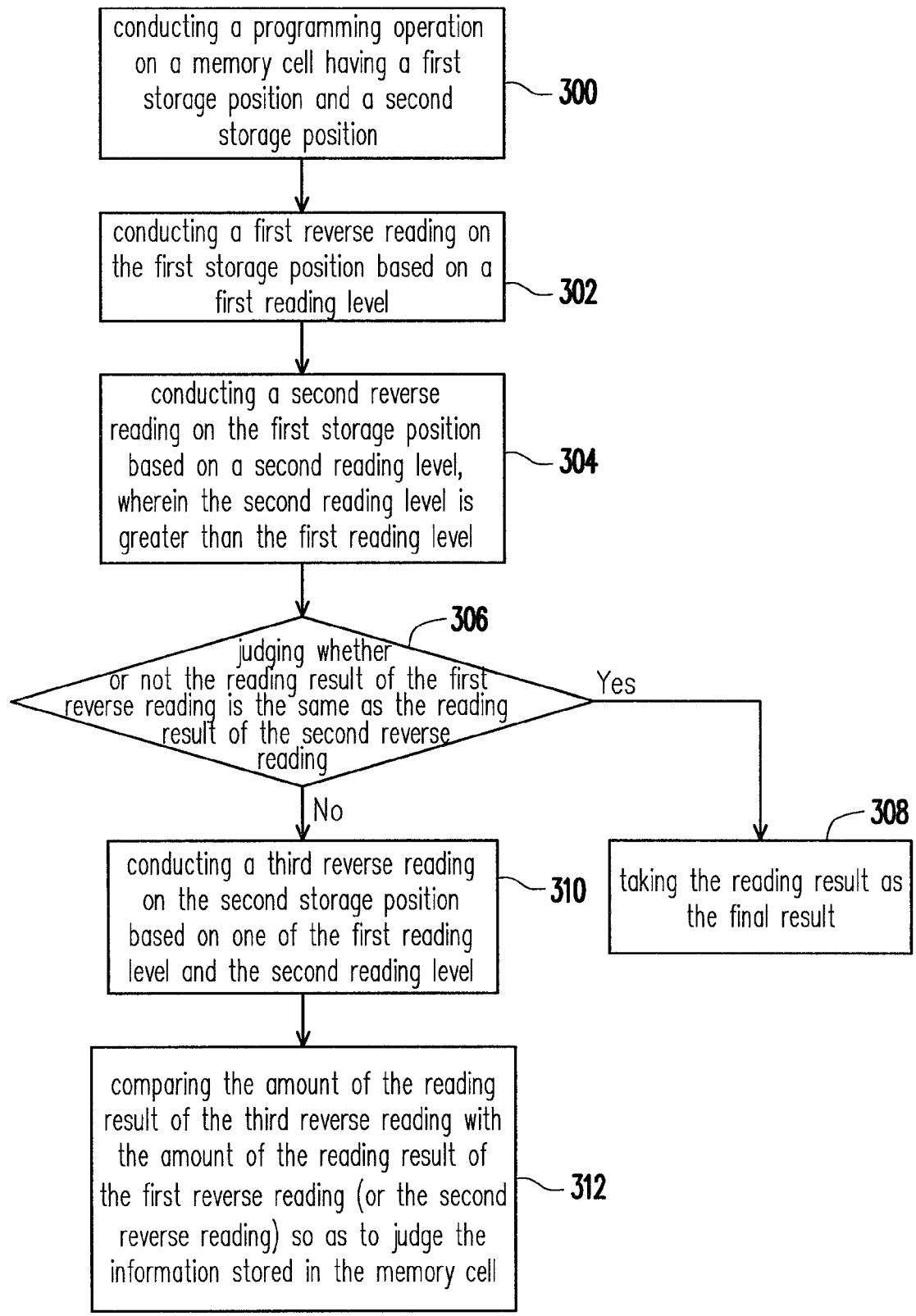
FIG. 8A is a schematic flow chart of a reading method of a non-volatile memory for reducing the second-bit effect thereof according to the present invention.
Figure 8B:
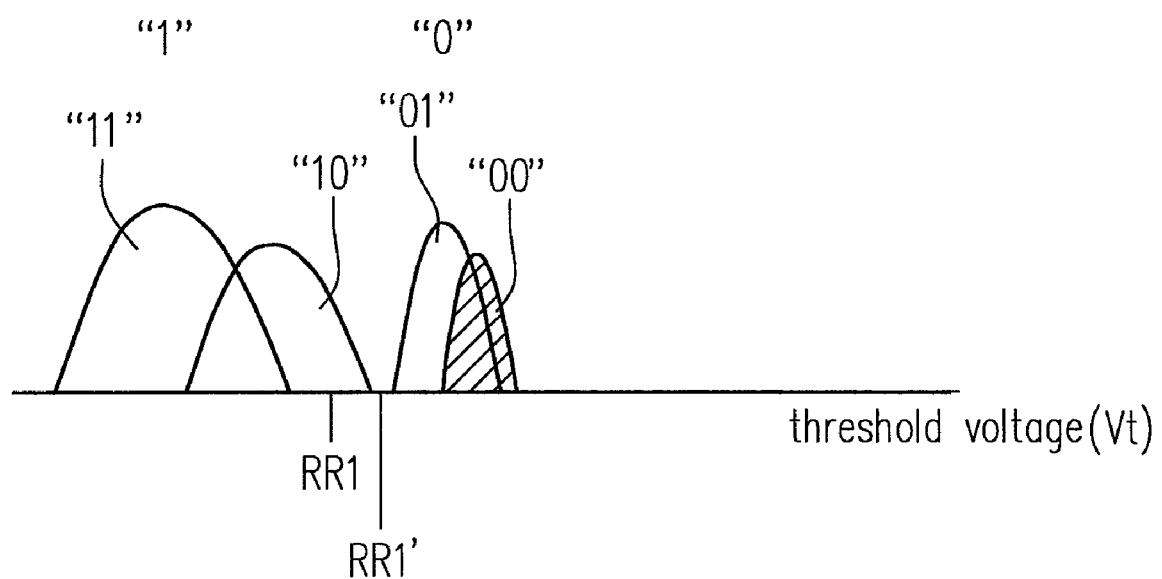
FIG. 8B is a diagram showing reading levels of a memory cell according to the present invention.

FIG. 8A is a schematic flow chart of a reading method of a non-volatile memory for reducing the second-bit effect thereof according to the present invention and FIG. 8B is a diagram showing reading levels of a memory cell according to the present invention.

As shown by FIG. 8A, when conducting a reading operation on the memory cell having a first storage position and a second storage position (step 300), a first reverse reading on the first storage position is conducted based on a first reading level corresponding to the first programming verification level PV1 (step 302), and a second reverse reading on the first storage position is conducted based on a second reading level corresponding to the second programming verification level PV2 (step 304), wherein the second reading level is greater than the first reading level. After that, it is judged whether or not the reading result of the first reverse reading is the same as the reading result of the second reverse reading (step 306). When the reading result of the first reverse reading is the same as the reading result of the second reverse reading, the reading result is taken as the final result (step 308). When the reading result of the first reverse reading is different from the reading result of the second reverse reading, a third reverse reading on the second storage position is conducted based on the first reading level (or based on the second reading level) (step 310). Further, the amount of the reading result of the third reverse reading on the second storage position is compared with the amount of the reading result of the first reverse reading (or the second reverse reading) so as to judge the information stored in the memory cell (step 312).

In the above-mentioned step 306, when the reading result of the first reverse reading is the same as the reading result of the second reverse reading, it indicates the state of the memory cell is "11" or "00".

For example, referring to FIG. 8B, in terms of the memory cell of the state "11", when the reading result of the first reverse reading is "1" and the reading result of the second reverse reading is also "1", it indicates the first storage position of the memory cell is "1", so that it can be correctly judged that the first storage position of the memory cell of the state "11" is "1".

In terms of the memory cell of the state "00", when the reading result of the first reverse reading is "0" and the reading result of the second reverse reading is also "0", it indicates the first storage position of the memory cell is "0", so that it can be correctly judged that the first storage position of the memory cell of the state "00" is "0".

In the above-mentioned step 306, when the reading result of the first reverse reading is different from the reading result of the second reverse reading, it indicates the state of the memory cell is "10" or "01", which means there is a misjudgement for the first reverse reading and the second reverse reading so that an additional third reverse reading on the second storage position needs to be conducted. Then, it is judged whether or not the state of the memory cell is "10" or "01" according to the reading result (current) of the third reverse reading on the second storage position and the reading result (current) of the first reverse reading (or second reverse reading). When the current of the first reverse reading (or second reverse reading) is greater than the current of the third reverse reading conducted based on the first reading level (or based on the second reading level) on the second storage position, it indicates the information stored in the memory cell is "10", which means it can be correctly judged that the first storage position of the memory cell is "1". When the current of the first reverse reading (or second reverse reading) is less than the current of the third reverse reading conducted based on the first reading level (or based on the second reading level) on the second storage position, it indicates the information stored in the memory cell is "01", which means it can be correctly judged that the first storage position of the memory cell is "0" as well.

For example, referring to FIG. 8B, in terms of the memory cell of the state "10", when the reading result of the second reverse reading is judged as "1" but the reading result of the first reverse reading is misjudged as "0", the first reading level (or second reading level) is used for conducting the third reverse reading on the second storage position of the memory cell. When the current of the first reverse reading is greater than the current of the third reverse reading conducted based on the first reading level or the current of the second reverse reading is greater than the current of the third reverse reading conducted based on the second reading level, it indicates the first storage position of the memory cell is "1", which means the memory cell of the state "10" can be correctly judged by reading.

In terms of the memory cell of the state "01", when the reading result of the first reverse reading is "0" and the reading result of the second reverse reading is "1", the first reading level (or second reading level) is used for conducting the third reverse reading on the second storage position of the memory cell. When the current of the first reverse reading on the first storage position is less than the current of the third reverse reading conducted based on the first reading level on the second storage position or the current of the second reverse reading on the first storage position is less than the current of the third reverse reading conducted based on the second reading level on the second storage position, it indicates the first storage position of the memory cell is "0", which means the memory cell of the state "01" can be correctly judged by reading.

Since the above-mentioned operation method adopts two sets of programming verification levels and two sets of reading levels to conduct reverse reading operations twice and a reverse reading on the second storage position operation, the invented scheme is advantageous in easily judging the state of the memory cell by reading and avoiding a misjudgement caused by the second-bit effect.

Figure 9:
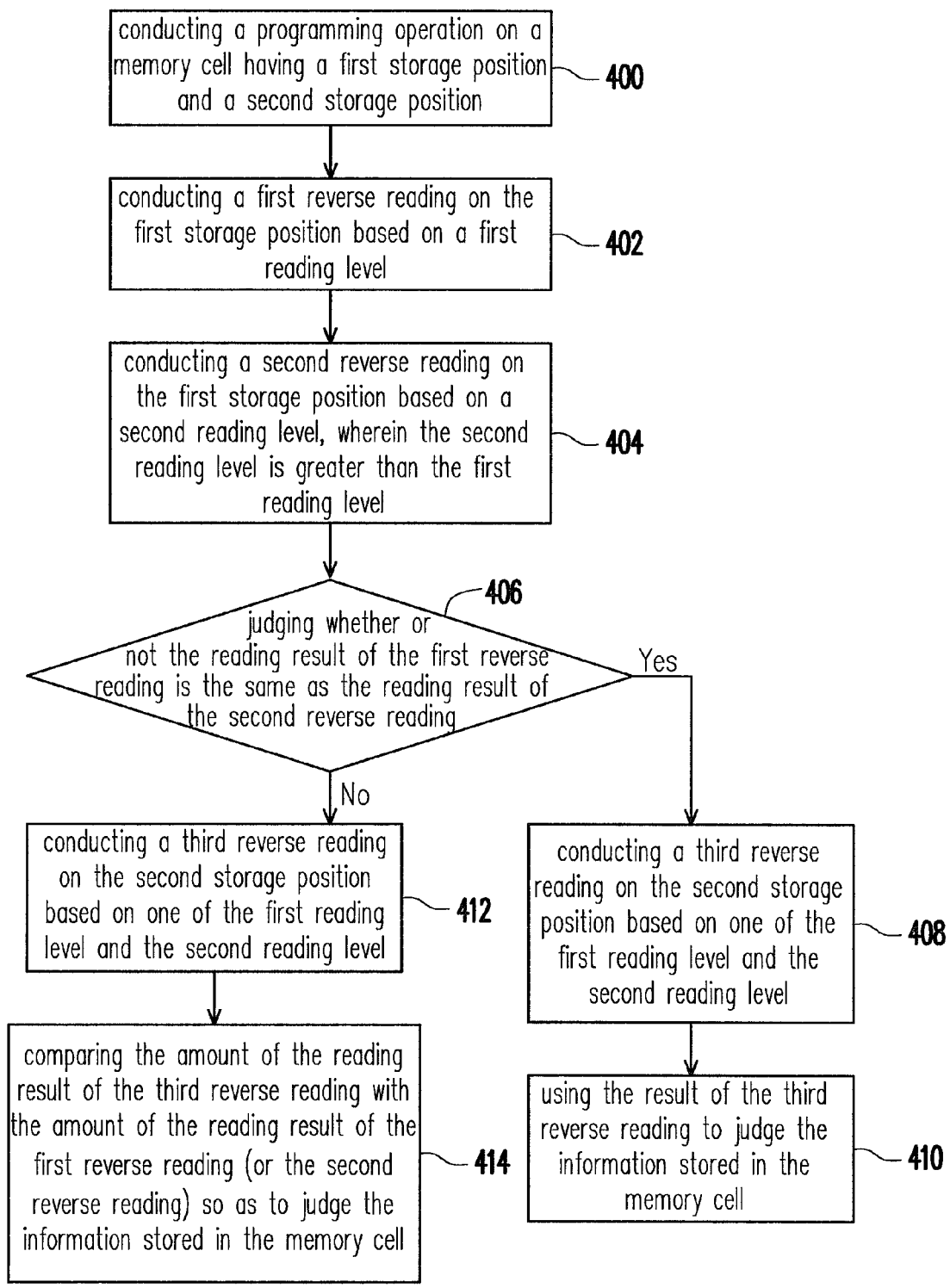
FIG. 9 is a schematic flow chart of a reading method of a non-volatile memory for reducing the second-bit effect thereof according to the present invention.

FIG. 9 is a schematic flow chart of a reading method of a non-volatile memory for reducing the second-bit effect thereof according to the present invention.

As shown by FIG. 9, when conducting a reading operation on the memory cell having a first storage position and a second storage position (step 400), a first reverse reading on the first storage position is conducted based on a first reading level corresponding to the first programming verification level PV1 (step 402), and a second reverse reading on the first storage position is conducted based on a second reading level corresponding to the second programming verification level PV2 (step 404), wherein the second reading level is greater than the first reading level. After that, it is judged whether or not the reading result of the first reverse reading is the same as the reading result of the second reverse reading (step 406).

When the reading result of the first reverse reading is the same as the reading result of the second reverse reading, the first reading level (or second reading level) is used to conduct the third reverse reading on the second storage position (step 408). And then, the result of the third reverse reading on the second storage position is used to judge the information stored in the memory cell (step 410). When the reading result of the first reverse reading is different from the reading result of the second reverse reading, a third reverse reading on the second storage position is conducted based on the first reading level (or based on the second reading level) (step 412). Further, the amount of the reading result of the third reverse reading on the second storage position is compared with the amount of the reading result of the first reverse reading (or the second reverse reading) on the first storage position so as to judge the information stored in the memory cell (step 414).

In the above-mentioned step 406, when the reading result of the first reverse reading is "1" and the reading result of the second reverse reading is also "1", it indicates the state of the memory cell is "11" or "10". In the above-mentioned step 408, the first reading level is used to conduct the third reverse reading on the second storage position. In the above-mentioned step 410, when the reading result of the third reverse reading on the second storage position is "1", it indicates the state of the memory cell is "11"; when the reading result of the third reverse reading on the second storage position is "0", it indicates the state of the memory cell is "10".

In the above-mentioned step 406, when the reading result of the first reverse reading is "0" and the reading result of the second reverse reading is also "0", it indicates the state of the memory cell is "00" or "01". In the above-mentioned step 408, the second reading level is used to conduct the third reverse reading on the second storage position. In the above-mentioned step 410, when the reading result of the third reverse reading on the second storage position is "1", it indicates the state of the memory cell is "01"; when the reading result of the third reverse reading on the second storage position is "0", it indicates the state of the memory cell is "00".

In the above-mentioned step 406, when the reading result of the first reverse reading is "0" and the reading result of the second reverse reading is "1", it indicates the state of the memory cell is "01" or "10". In the above-mentioned step 412, the third reverse reading on the second storage position is conducted. In the above-mentioned step 414, it is judged whether or not the information stored in the memory cell is "01" or "10" according to the amounts of the reading results (currents) of the third reverse reading on the second storage position and the first reverse reading (or second reverse reading) on the first storage position. When the current of the first reverse reading (or second reverse reading) is greater than the current of the third reverse reading conducted based on the first reading level (or based on the second reading level) on the second storage position, it indicates the information stored in the memory cell is "10". When the current of the first reverse reading (or second reverse reading) is less than the current of the third reverse reading conducted based on the first reading level (or based on the second reading level on the second storage position, it indicates the information stored in the memory cell is "01".

Since the above-mentioned operation method adopts two sets of programming verification levels and two sets of reading levels to conduct reverse reading operations twice and a reverse reading operation on the second storage position, the invented scheme is advantageous in easily judging the state of the memory cell by reading and avoiding a misjudgement caused by the second-bit effect.

Figure 10A:
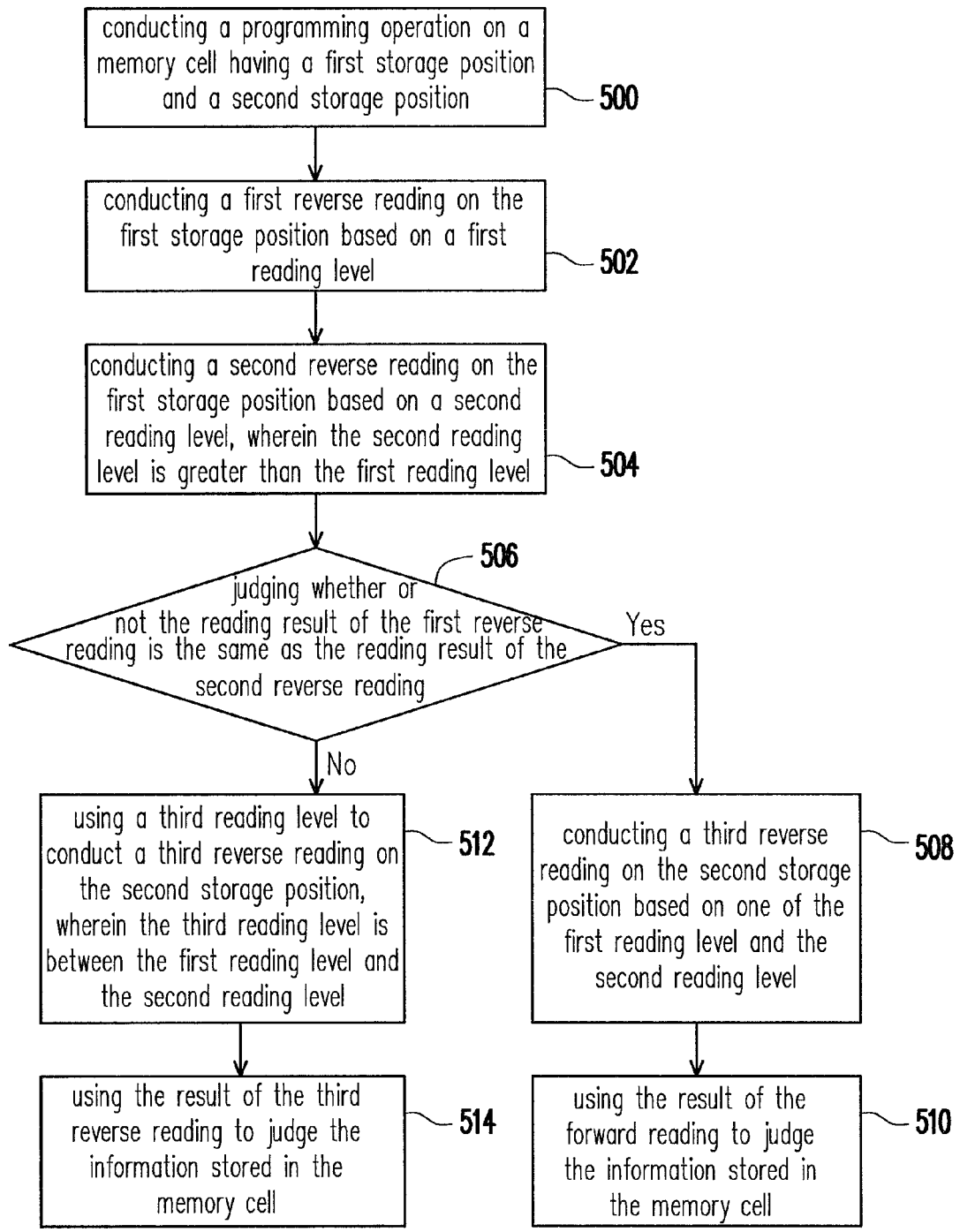
FIG. 10A is a schematic flow chart of a reading method of a non-volatile memory for reducing the second-bit effect thereof according to the present invention.
Figure 10B:
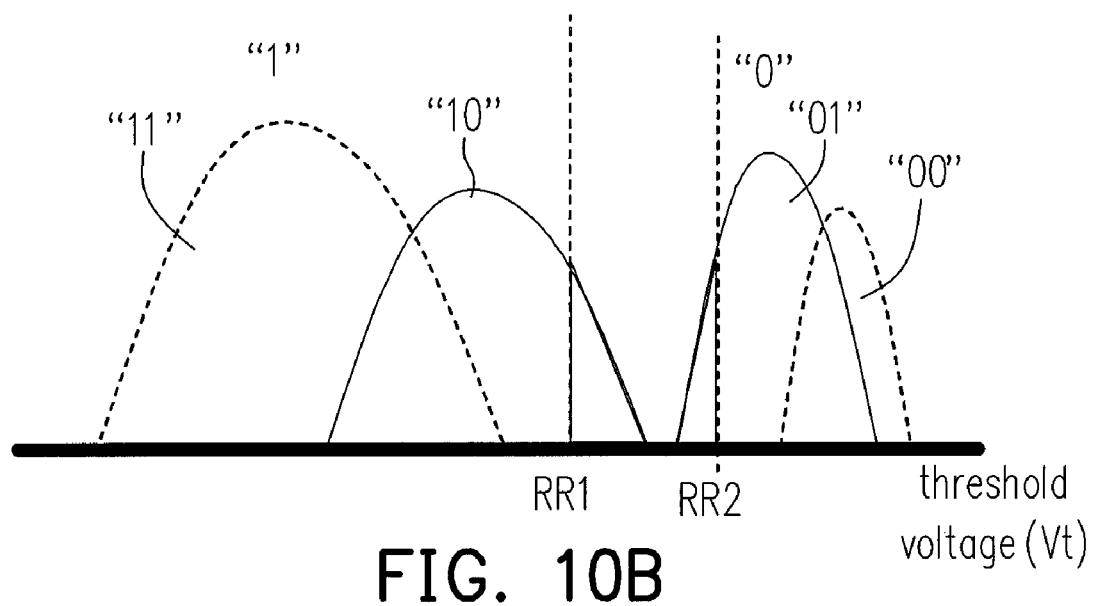
FIGS. 10B and 10C are diagrams showing reading levels of a memory cell according to the present invention.
Figure 10C:
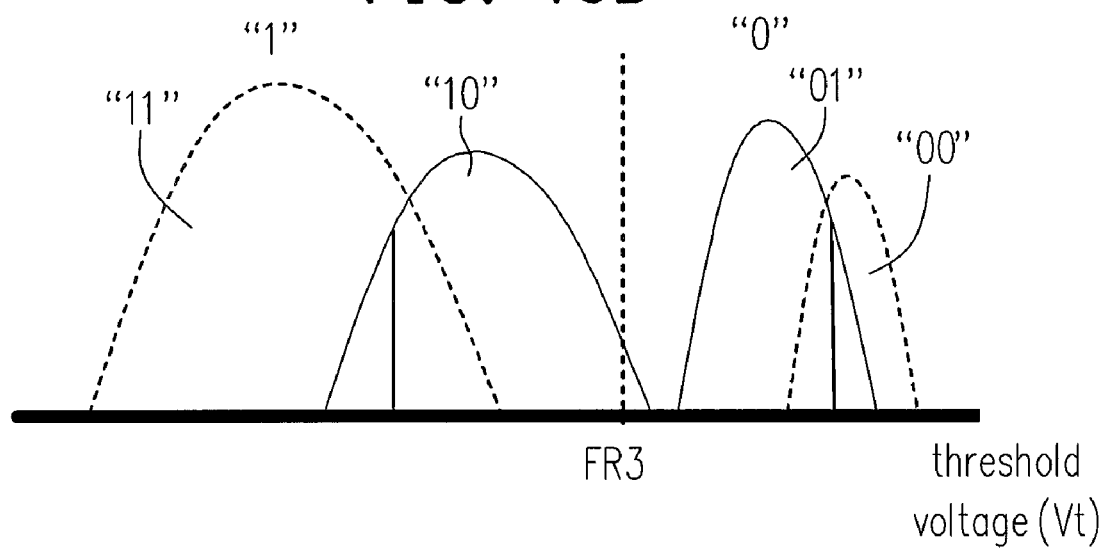

FIG. 10A is a schematic flow chart of a reading method of a non-volatile memory for reducing the second-bit effect thereof according to the present invention, and FIGS. 10B and 10C are diagrams showing reading levels of a memory cell according to the present invention.

As shown by FIG. 10A, when conducting a reading operation on the memory cell having a first storage position and a second storage position (step 500), a first reverse reading on the first storage position is conducted based on a first reading level corresponding to the first programming verification level PV1 (step 502), and a second reverse reading on the first storage position is conducted based on a second reading level corresponding to the second programming verification level PV2 (step 504), wherein the second reading level is greater than the first reading level. After that, it is judged whether or not the reading result of the first reverse reading is the same as the reading result of the second reverse reading (step 506). When the reading result of the first reverse reading is the same as the reading result of the second reverse reading, the first reading level (or second reading level) is used to conduct a third reverse reading on the second storage position (step 508). Then, the result of the third reverse reading on the second storage position is used to judge the information stored in the memory cell (step 510). When the reading result of the first reverse reading is different from the reading result of the second reverse reading, a third reading level is used to conduct the third reverse reading on the second storage position, wherein the third reading level is between the first reading level and the second reading level (step 512). Further, the information stored in the memory cell is judged according to the reading result of the above-mentioned forward reading (step 514).

In the above-mentioned step 506, when the reading result of the first reverse reading is "1" and the reading result of the second reverse reading is also "1", it indicates the state of the memory cell is "11" or "10". In the above-mentioned step 508, the first reading level is used to conduct the third reverse reading on the second storage position. In the above-mentioned step 510, when the reading result of the third reverse reading on the second storage position is "1", it indicates the state of the memory cell is "11"; when the reading result of the third reverse reading on the second storage position is "0", it indicates the state of the memory cell is "10".

In the above-mentioned step 506, when the reading result of the first reverse reading is "0" and the reading result of the second reverse reading is also "0", it indicates the state of the memory cell is "01" or "00". In the above-mentioned step 508, the second reading level is used to conduct the third reverse reading on the second storage position. In the above-mentioned step 510, when the reading result of the third reverse reading is "1", it indicates the state of the memory cell is "01"; when the reading result of the third reverse on the second storage position reading is "0", it indicates the state of the memory cell is "00".

In the above-mentioned step 506, as shown by FIG. 10B, when the reading result of the first reverse reading is "0" and the reading result of the second reverse reading is "1", it indicates the state of the memory cell is "01" or "10". In the above-mentioned step 512, as shown by FIG. 10C, the third reading level is used to conduct the third reverse reading on the second storage position. In the above-mentioned step 514, when the reading result of the third reverse reading on the second storage position is "1", it indicates the state of the memory cell is "01"; when the reading result of the third reverse reading on the second storage position is "0", it indicates the state of the memory cell is "10".

Since the above-mentioned operation method adopts two sets of programming verification levels and two sets of reading levels to conduct reverse reading operations on the first storage position twice and a reverse reading operation on the second storage position, the invented -scheme is advantageous in easily judging the state of the memory cell by reading and avoiding a misjudgement caused by the second-bit effect.

Figure 11A:
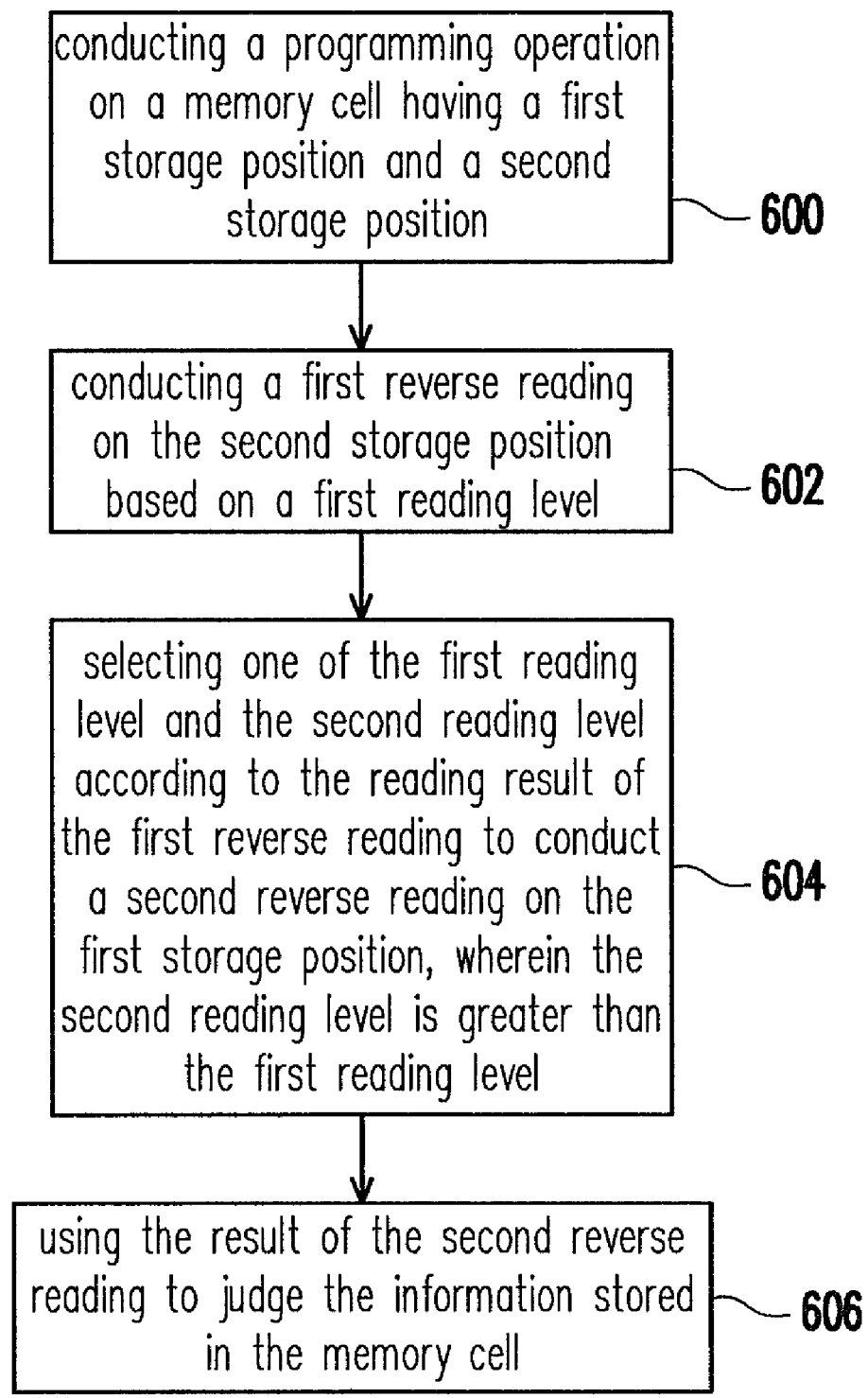
FIG. 11A is a schematic flow chart of a reading method of a non-volatile memory for reducing the second-bit effect thereof according to the present invention.

FIG. 11A is a schematic flow chart of a reading method of a non-volatile memory for reducing the second-bit effect thereof according to the present invention and FIGS. 11B-11E are diagrams showing reading levels of a memory cell according to the present invention.

As shown by FIG. 11A, when conducting a reading operation on the memory cell having a first storage position and a second storage position (step 600), a first reverse reading on the second storage position is conducted based on a first reading level corresponding to the first programming verification level PV1 (step 602). Then, the first reading level or the second reading level is selected according to the reading result of the first reverse reading on the second storage position, and a second reverse reading on the first storage position is conducted based on the first reading level (or the second reading level), wherein the second reading level is greater than the first reading level (step 604). After that, the information stored in the memory cell is judged according to the reading result of the second reverse reading (step 606).

Figure 11B:
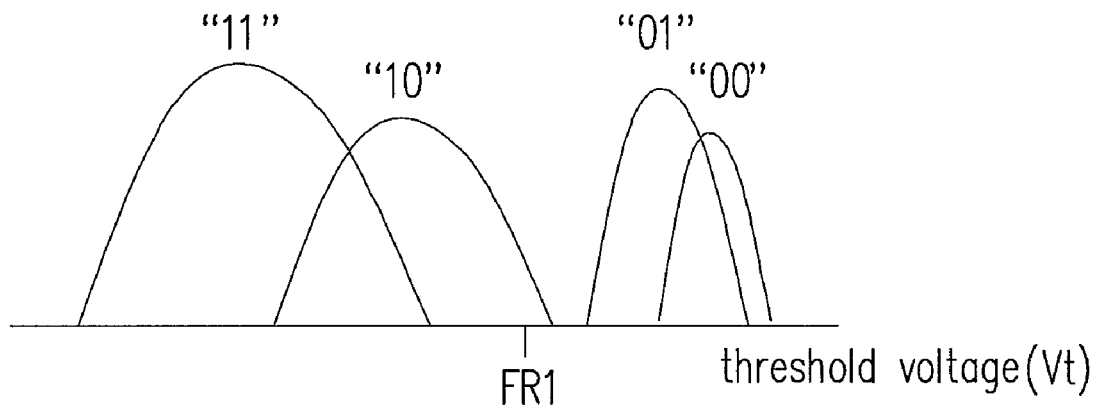
FIGS. 11B-11E are diagrams showing reading levels of a memory cell according to the present invention.
Figure 11C:
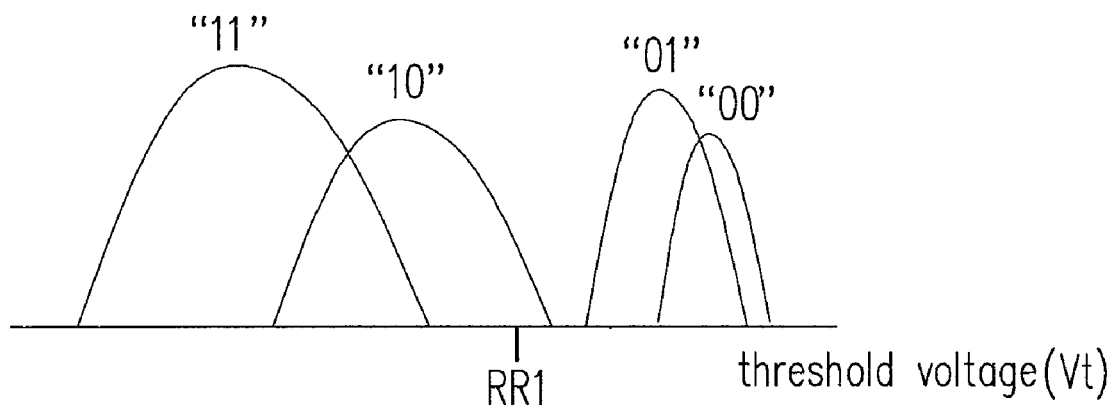

In the above-mentioned step 604, as shown by FIG. 11B, when the reading result of the first reverse reading on the second storage position is "x1", it indicates the state of the memory cell is "11" or "01". Then, as shown by FIG. 11C, the first reading level is used to conduct the second reverse reading on the first storage position. In the above-mentioned step 606, when the reading result of the second reverse reading on the first storage position is "1", it indicates the state of the memory cell is "11"; when the reading result of the second reverse reading on the first storage position is "0", it indicates the state of the memory cell is "01".

Figure 11D:
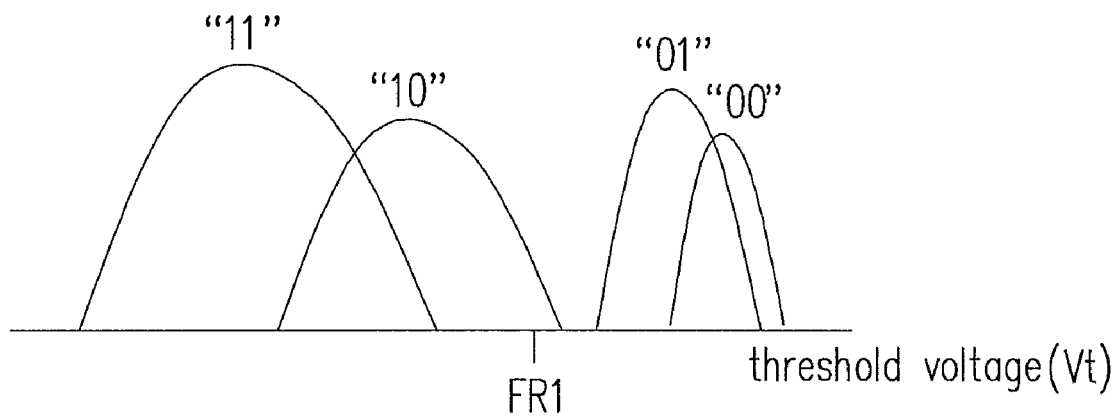
Figure 11E:
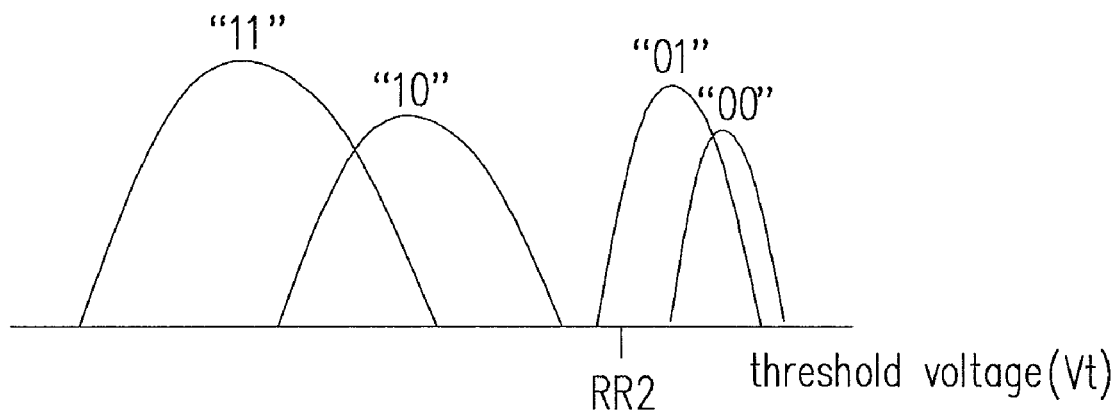

In the above-mentioned step 604, as shown by FIG. 11D, when the reading result of the first reverse reading on the second storage position is "x0", it indicates the state of the memory cell is "10" or "00". Then, as shown by FIG. 11E, the second reading level is used to conduct the second reverse reading on the first storage position. In the above-mentioned step 606, when the reading result of the second reverse reading on the first storage position is "1", it indicates the state of the memory cell is "10"; when the reading result of the second reverse reading on the first storage position is "0", it indicates the state of the memory cell is "00".

Since the above-mentioned operation method adopts two sets of programming verification levels and two sets of reading levels to conduct a reverse reading operation on the second storage position first, followed by conducting a reverse reading operation on the first storage position, the invented scheme is advantageous in easily judging the state of the memory cell by reading and avoiding a misjudgement caused by the second-bit effect.

Figure 12:
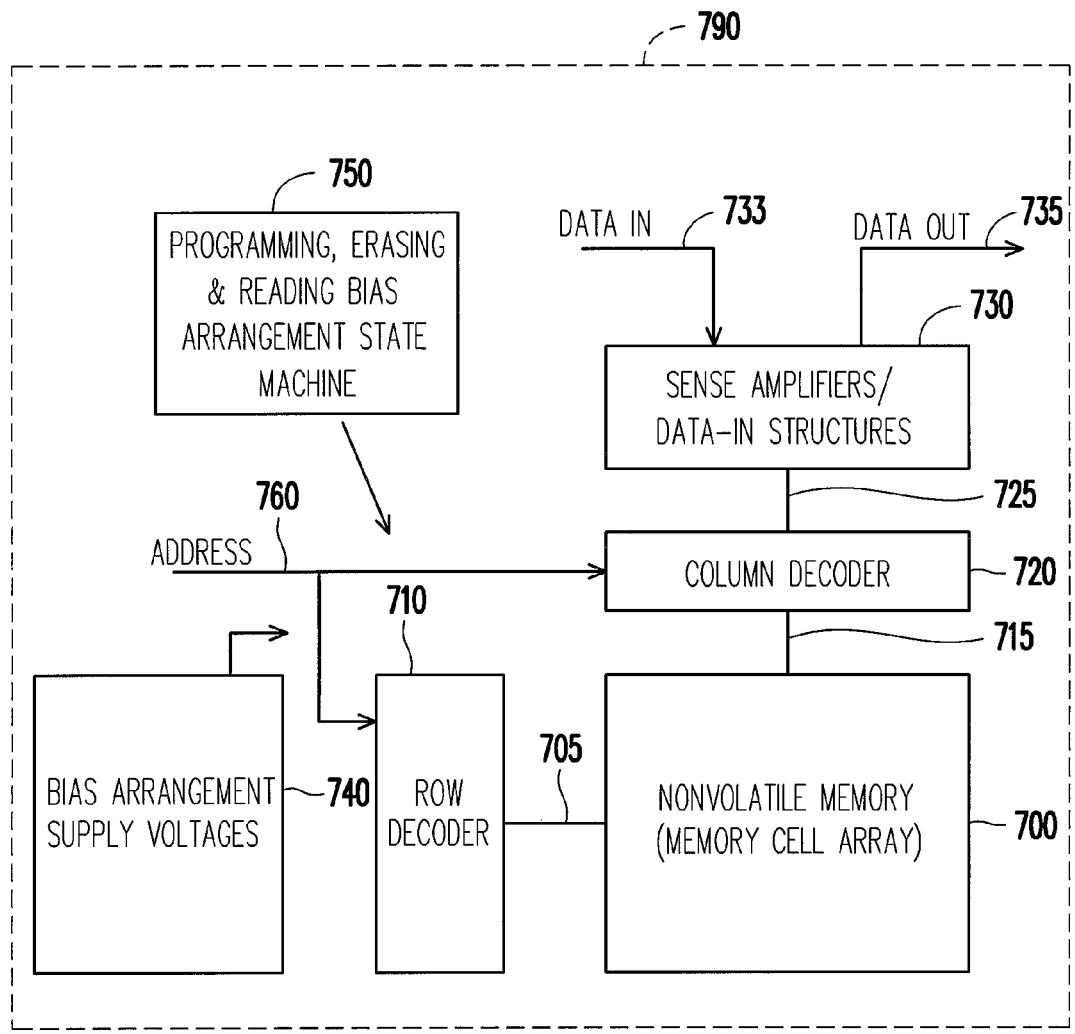
FIG. 12 is a simplified circuit block diagram of an integrated circuit applying an embodiment of the present invention.

FIG. 12 is a simplified circuit block diagram of an integrated circuit applying an embodiment of the present invention. The circuit 790 includes a nonvolatile memory (memory cell array) 700 implemented using memory cells which have multi-bits per cell, on a semiconductor substrate. The memory cells are single level memory cells or N-level memory cells (N is a positive integer greater than 2) having a first storage position and a second storage position. A row decoder 710 is coupled to a plurality of word lines 705, and arranged along rows in the memory cell array 700. A column decoder 720 is coupled to a plurality of bit lines 715 arranged along columns in the memory cell array 700 for reading and programming data from the multi-bit memory cells in the array 700. Addresses are supplied on bus 760 to column decoder 720 and row decoder 710. Sense amplifiers and data-in structures in block 730 are coupled to the column decoder 720 via data bus 725. Data is supplied via the data-in line 733 from input/output ports on the circuit 790 or from other data sources internal or external to the circuit 790, to the data-in structures in block 730. In the illustrated embodiment, other circuitry is included in the circuit 790, such as a general purpose processor or special purpose application circuitry, or a combination of modules supported by the multi-bit memory cell array. Data is supplied via the data-out line 735 from the sense amplifiers in block 730 to input/output ports on the circuit 790, or to other data destinations internal or external to the circuit 790.

A programming, erasing & reading bias arrangement state machine 750 includes a means for determining the state of first storage position and a second storage position of the cell, and a means for selecting a first set of operation levels or a second set of operation levels according to state of first storage position and a second storage position of the cell. A controller implemented in this example using programming, erasing & reading bias arrangement state machine 750 controls the application of bias arrangement supply voltages 740 (such as read, program, erase, erase verify and program verify voltages) according to the first set of operation levels or the second set of operation levels. The controller can be implemented using special-purpose logic circuitry as known in the art. In alternative embodiments, the controller comprises a general-purpose processor, which executes a computer program to control the operations of the device. In yet other embodiments, a combination of special-purpose logic circuitry and a general-purpose processor may be utilized for implementation of the controller.

In summary, the operation method of a non-volatile memory for reducing the second-bit effect in the non-volatile memory of the present invention can increase the operation window on a memory cell and avoid a misjudgement caused by the second-bit effect.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An operation method of a non-volatile memory, suitable for an N-level memory cell having a source region and a drain region disposed in a substrate, a charge storage structure having a first storage position and a second storage position disposed between the source region and the drain region on the substrate, and a gate disposed on the charge storage structure (wherein N is a positive integer greater than 2), the method comprising:

determining a set of operation levels for operating the first storage position only according to a level of the second storage position;

when the level of the second storage position is a lower level, operating the first storage position according to a first set of operation levels; and when the level of the second storage position is a higher level, operating the first storage position according to a second set of operation levels.

2. The operation method of a non-volatile memory as claimed in claim 1, wherein the lower level is a positive integer equal to or smaller than N/2, and the higher level is a positive integer greater than N/2.

3. The operation method of a non-volatile memory as claimed in claim 1, wherein the second set of operation levels and the first set of operation levels respectively comprise a plurality of operation levels from a first operation level to an (N−1)-th operation level respectively having a level sequentially from small one to large one, and the i-th operation level (i=1, ..., N−1, positive integers) in the second set of operation levels is greater than the i-th operation level in the first set of operation levels.

4. The operation method of a non-volatile memory as claimed in claim 3, wherein the operation method is a method for programming, and the first set of operation levels and the second set of operation levels are sets of programming verification levels.

5. The operation method of a non-volatile memory as claimed in claim 3, wherein the operation method is a reading method, and the first set of operation levels and the second set of operation levels are sets of reading levels.

6. The operation method of a non-volatile memory as claimed in claim 1, wherein the second set of operation levels and the first set of operation levels respectively comprise a plurality of operation levels from a first operation level to an (N−1)-th operation level respectively having a level sequentially from small one to large one, and the i-th operation level (i=1, ..., N−1, positive integers) in the second set of operation levels is equal to the (i+1)-th operation level in the first set of operation levels.

7. The operation method of a non-volatile memory as claimed in claim 6, wherein the operation method is a method for programming, and the first set of operation levels and the second set of operation levels are sets of programming verification levels.

8. The operation method of a non-volatile memory as claimed in claim 6, wherein the operation method is a reading method, and the first set of operation levels and the second set of operation levels are sets of reading levels.

9. An operation method of a non-volatile memory, suitable for an N-level memory cell having a source region and a drain region disposed in a substrate, a charge storage structure having a first storage position and a second storage position disposed between the source region and the drain region on the substrate, and a gate disposed on the charge storage structure(wherein N is a positive integer greater than 2), the method comprising:

when conducting a programming operation, determining a set of programming verification levels for verifying the state of the first storage position only according to a level of the second storage position, wherein:

when the level of the second storage position is a lower level, verifying the state of the first storage position of being programmed according to a first set of programming verification levels; and when the level of the second storage position is a higher level, verifying the state of the first storage position of being programmed according to a second set of operation levels.

10. The operation method of a non-volatile memory as claimed in claim 9, further comprising:

when conducting a reading operation, determining a set of reading levels for reading the first storage position according to the first set of programming verification levels and the second set of programming verification levels, wherein:

when the programming state of the first storage position is verified based on the first set of programming verification levels, reading the first storage position according to a first set of reading levels corresponding to the first set of programming verification levels; and when the programming state of the first storage position is verified based on the second set of programming verification levels, reading the first storage position according to a second set of reading levels corresponding to the second set of programming verification levels.

11. The operation method of a non-volatile memory as claimed in claim 9, wherein the lower level is a positive integer equal to or smaller than N/2, and the higher level is a positive integer greater than N/2.

12. The operation method of a non-volatile memory as claimed in claim 9, wherein the second set of programming verification levels and the first set of programming verification levels respectively comprise a plurality of programming verification levels from a first programming verification level to an (N−1)-th programming verification level respectively having a level sequentially from small one to large one, and the i-th programming verification level (i=1, . . . , N−1, positive integers) in the second set of programming verification levels is greater than the i-th programming verification level in the first set of programming verification levels.

13. The operation method of a non-volatile memory as claimed in claim 9, wherein the second set of programming verification levels and the first set of programming verification levels respectively comprise a plurality of programming verification levels from a first programming verification level to an (N−1)-th programming verification level respectively having a level sequentially from small one to large one, and the i-th programming verification level (i=1, . . . , N−1, positive integers) in the second set of programming verification levels is equal to the (i+1)-th programming verification level in the first set of programming verification levels.

14. The operation method of a non-volatile memory as claimed in claim 10, wherein the second set of reading levels and the first set of reading levels respectively comprise a plurality of reading levels from a first reading level to an (N−1)-th reading level respectively having a level sequentially from small one to large one, and the i-th reading level (i=1, . . . , N−1, positive integers) in the second set of reading levels is greater than the i-th reading level in the first set of reading levels.

15. The operation method of a non-volatile memory as claimed in claim 10, wherein the second set of reading levels and the first set of reading levels respectively comprise a plurality of reading levels from a first reading level to an (N−1)-th reading level respectively having a level sequentially from small one to large one, and the i-th reading level (i=1, . . . , N−1, positive integers) in the second set of reading levels is equal to the (i+1)-th reading level in the first set of reading levels.

16. An operation method of a non-volatile memory, suitable for a memory cell having a first storage position and a second storage position, the method comprising:

when conducting a programming operation, verifying the state of the memory cell of being programmed according to a first programming verification level;

when both of the first storage position and the second storage position need to be programmed into a higher level, verifying the state of the memory cell of being programmed according to a second programming verification level, wherein the second programming verification level is greater than the first programming verification level; and conducting a first reverse reading on the first storage position based on a first reading level corresponding to the first programming verification level;

conducting a second reverse reading on the first storage position based on a second reading level corresponding to the second programming verification level, wherein the second reading level is greater than the first reading level;

conducting a third reverse reading on the second storage position based on one of the first reading level, the second reading level or a third reading level, wherein the third reading level is between the first reading level and the second reading level; and judging the information stored in the memory cell according to reading results of the first reverse reading, the second reverse reading and the third reverse reading.

17. The operation method of a non-volatile memory as claimed in claim 16, wherein the step of judging the information stored in the memory cell according to the reading results of the first reverse reading, the second reverse reading and the third reverse reading comprises:

when the reading result of the first reverse reading is the same as the reading result of the second reverse reading, taking the reading result as a final result.

18. The operation method of a non-volatile memory as claimed in claim 16, wherein the step of judging the information stored in the memory cell according to the reading results of the first reverse reading, the second reverse reading and the third reverse reading comprises:

when the reading result of the first reverse reading is different from the reading result of the second reverse reading and the third reverse reading is conducted based on the first reading level, comparing the amount of the reading result of the third reverse reading with the amount of the reading result of the first reverse reading so as to judge the information stored in the memory cell.

19. The operation method of a non-volatile memory as claimed in claim 16, wherein the step of judging the information stored in the memory cell according to the reading results of the first reverse reading, the second reverse reading and the third reverse reading comprises:

when the reading result of the first reverse reading is different from the reading result of the second reverse reading and the third reverse reading is conducted based on the second reading level, comparing the amount of the reading result of the third reverse reading with the amount of the reading result of the second reverse reading so as to judge the information stored in the memory cell.

20. The operation method of a non-volatile memory as claimed in claim 16, wherein the step of judging the information stored in the memory cell according to the reading results of the first reverse reading, the second reverse reading and the third reverse reading comprises:

when the reading result of the first reverse reading is the same as the reading result of the second reverse reading and the third reverse reading is conducted based on the first reading level, judging the information stored in the memory cell according to the reading result of the third reverse reading.

21. The operation method of a non-volatile memory as claimed in claim 16, wherein the step of judging the information stored in the memory cell according to the reading results of the first reverse reading, the second reverse reading and the third reverse reading comprises:

when the reading result of the first reverse reading is the same as the reading result of the second reverse reading and the third reverse reading is conducted based on the second reading level, judging the information stored in the memory cell according to the reading result of the third reverse reading.

22. The operation method of a non-volatile memory as claimed in claim 16, wherein the step of judging the information stored in the memory cell according to the reading results of the first reverse reading, the second reverse reading and the third reverse reading comprises:
when the reading result of the first reverse reading is different from the reading result of the second reverse reading and the third reverse reading is conducted based on the first reading level, comparing the amount of the reading result of the third reverse reading with the amount of the reading result of the first reverse reading so as to judge the information stored in the memory cell.

23. The operation method of a non-volatile memory as claimed in claim 16, wherein the step of judging the information stored in the memory cell according to the reading results of the first reverse reading, the second reverse reading and the third reverse reading comprises:
when the reading result of the first reverse reading is different from the reading result of the second reverse reading and the third reverse reading is conducted based on the second reading level, comparing the amount of the reading result of the reverse reading with the amount of the reading result of the second reverse reading so as to judge the information stored in the memory cell.

24. The operation method of a non-volatile memory as claimed in claim 16, wherein the step of judging the information stored in the memory cell according to the reading results of the first reverse reading, the second reverse reading and the third reverse reading comprises:
when the reading result of the first reverse reading is different from the reading result of the second reverse reading and the third reverse reading on the second storage position is conducted based on the third reading level, judging the information stored in the memory cell according to the reading result of the third reverse reading.

25. The operation method of a non-volatile memory as claimed in claim 16, further comprising:
conducting a first reverse reading on the second storage position based on a first reading level corresponding to the first programming verification level;
conducting a second reverse reading on the first storage position based on one of the first reading level and a second reading level corresponding to the second programming verification level according to the reading result of the first reverse reading on the second storage position, wherein the second reading level is greater than the first reading level; and
judging the information stored in the memory cell according to the reading result of the second reverse reading.

26. A non-volatile memory, comprising:
a source region and a drain region, disposed in a substrate;
a charge storage structure, disposed between the source region and the drain region on the substrate, wherein the charge storage structure has a first storage position and a second storage position;
a gate, disposed on the charge storage structure; and
a logic circuit determining a set of operation levels for operating the first storage position only according to a level of the second storage position, when the level of the second storage position is a lower level, operating the first storage position according to a first set of operation levels, and when the level of the second storage position is a higher level, operating the first storage position according to a second set of operation levels.

27. The non-volatile memory as claimed in claim 26, wherein the non-volatile memory is an N-level non-volatile memory (wherein N is a positive integer greater than 2), the second set of operation levels and the first set of operation levels respectively comprise a plurality of operation levels from a first operation level to an (N−1)-th operation level respectively having a level sequentially from small one to large one, and the i-th operation level (i=1, ..., N−1, positive integers) in the second set of operation levels is greater than the i-th operation level in the first set of operation levels.

28. The non-volatile memory as claimed in claim 26, wherein the non-volatile memory is an N-level non-volatile memory (wherein N is a positive integer greater than 2), the second set of operation levels and the first set of operation levels respectively comprise a plurality of operation levels from a first operation level to an (N−1)-th operation level respectively having a level sequentially from small one to large one, and the i-th operation level (i=1, ..., N−1, positive integers) in the second set of operation levels is equal to the (i+1)-th operation level in the first set of operation levels.

29. The non-volatile memory as claimed in claim 26, the first set of operation levels and the second set of operation levels are sets of programming verification levels or sets of reading levels.

30. A non-volatile memory, comprising:
a source region and a drain region, disposed in a substrate;
a charge storage structure, disposed between the source region and the drain region on the substrate, wherein the charge storage structure has a first storage position and a second storage position;
a gate, disposed on the charge storage structure; and
a logic circuit conducting a programming operation and then verifying the state of the memory of being programmed according to a first programming verification level, when both of the first storage position and the second storage position need to be programmed into a higher level, verifying the state of the memory of being programmed according to a second programming verification level, wherein the second programming verification level is greater than the first programming verification level, wherein the logic further performs:
conducting a first reverse reading on the first storage position based on a first reading level corresponding to the first programming verification level;
conducting a second reverse reading on the first storage position based on a second reading level corresponding to the second programming verification level, wherein the second reading level is greater than the first reading level;
conducting a third reverse reading on the second storage position based on one of the first reading level, the second reading level or a third reading level, wherein the third reading level is between the first reading level and the second reading level; and
judging the information stored in the memory cell according to reading results of the first reverse reading, the second reverse reading and the third reverse reading.

* * * * *